(12) United States Patent
Yoshida

(10) Patent No.: US 11,101,294 B2
(45) Date of Patent: Aug. 24, 2021

(54) ARRAY SUBSTRATE AND DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/655,940

(22) Filed: Oct. 17, 2019

(65) Prior Publication Data

US 2020/0127015 A1 Apr. 23, 2020

Related U.S. Application Data

(60) Provisional application No. 62/747,802, filed on Nov. 19, 2018.

(51) Int. Cl.
*H01L 27/12* (2006.01)
*G02F 1/1362* (2006.01)
*G02F 1/1368* (2006.01)

(52) U.S. Cl.
CPC ........ *H01L 27/1225* (2013.01); *G02F 1/1368* (2013.01); *G02F 1/136209* (2013.01); *G02F 1/136286* (2013.01)

(58) Field of Classification Search
CPC ........... H01L 27/1225; G02F 1/136286; G02F 1/1368
USPC ........................................................ 257/59
See application file for complete search history.

(56) References Cited

U.S. PATENT DOCUMENTS

| | | | |
|---|---|---|---|
| 8,853,703 B2* | 10/2014 | Park | H01L 29/78669 257/72 |
| 2005/0287692 A1* | 12/2005 | Kim | H01L 27/124 438/30 |
| 2006/0081849 A1* | 4/2006 | Lee | H01L 27/283 257/72 |
| 2006/0223222 A1* | 10/2006 | Choi | H01L 27/283 438/99 |
| 2013/0069069 A1* | 3/2013 | Koo | G02F 1/13458 257/59 |
| 2014/0042397 A1* | 2/2014 | Cho | H01L 27/1288 257/40 |
| 2017/0090229 A1 | 3/2017 | Imai et al. | |

FOREIGN PATENT DOCUMENTS

WO 2015/186619 A1 12/2015

* cited by examiner

*Primary Examiner* — Dzung Tran
(74) *Attorney, Agent, or Firm* — Keating & Bennett, LLP

(57) ABSTRACT

An array substrate includes pixel electrodes, switching components, a line, a common electrode, and a common line. The switching components are connected to the pixel electrodes. The line is connected to the switching components. The common electrode includes common electrode segments provided for the pixel electrodes, respectively. The common electrode segments are disposed to overlap at least sections of the pixel electrodes, respectively, via an interelectrode insulator but not to overlap the line. The common line extends to straddle the common line segments. The common line is connected to the common electrode segments. The common line is a section of a conductive film that includes a section configured as the line.

8 Claims, 21 Drawing Sheets

ARRAY SUBSTRATE AND DISPLAY DEVICE

CROSS REFERENCE TO RELATED APPLICATION

This application claims priority from U.S. Provisional Patent Application No. 62/747,802 filed on Oct. 19, 2018. The entire contents of the priority application are incorporated herein by reference.

TECHNICAL FIELD

The technology described herein relates to an array substrate and a display device.

BACKGROUND

An example of an array substrate included in a liquid crystal panel is described in WO 2015/186619. The array substrate is a semiconductor device that includes source lines, a light blocking portion, a source insulator, holes, channel regions, and an oxide semiconductor film, drain electrodes, a gate insulator, and gate electrodes. The source lines are formed on a substrate. The light blocking portion is disposed in the same layer as the source lines. The source insulator covers the source lines. The holes are drilled through the source insulator. The channel regions are prepared from an oxide semiconductor film formed on the source insulator to overlap the light blocking portion. The source electrodes are prepared from an oxide film that has a reduced resistance and connected to the source lines via the holes. The drain electrodes are prepared from sections of an oxide semiconductor film having a reduced resistance and opposed to the source electrodes with the channel regions therebetween. The gate insulator is formed on the channel regions. The gate electrodes are formed on the gate insulator to overlap the channel regions.

The semiconductor device includes the common electrode that overlaps the pixel electrodes via the insulator. The common electrode is disposed such the insulator that is different from the above-described insulator is disposed between the common electrode and the gate lines or the source lines connected to the TFTs.

As upsizing of liquid crystal panels progresses, resistance distribution may occur in the common electrode. This may cause a decrease in display quality. To reduce the decrease in display quality, common lines to apply a potential to the common electrode may be disposed to cross a display area. However, this requires additional common lines and contact holes in the insulator for connecting the common lines to the common electrode. Therefore, the number of photomasks required for the production increases and thus a production cost increases.

SUMMARY

The technology described herein was made in view of the above circumstances. An object is to reduce the number of photomasks.

An array substrate display device includes pixel electrodes, switching components, a line, a common electrode, and a common line. The switching components are connected to the pixel electrodes. The line is connected to the switching components. The common electrode includes common electrode segments provided for the pixel electrodes, respectively. The common electrode segments are disposed to overlap at least sections of the pixel electrodes, respectively, via an inter-electrode insulator but not to overlap the line. The common electrode is a section of a conductive film that includes a section configured as the line. The common line extends to straddle the common line segments. The common line is connected to the common electrode segments.

A display device includes the array substrate described above and an opposed substrate opposed to the array substrate.

According to the technology described herein, the number of photomasks can be reduced.

DETAILED DESCRIPTION

First Embodiment

Figure 1:
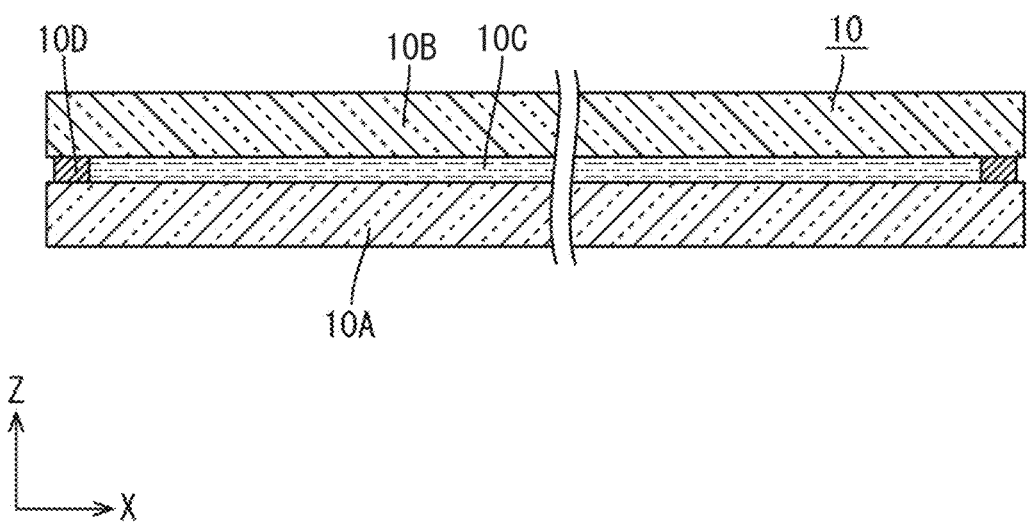
FIG. 1 is a cross-sectional view of a liquid crystal panel according to a first embodiment.

A first embodiment will be described in detail with reference to FIGS. 1 to 11. In this section, an array substrate 10A included in a liquid crystal panel 10 (a display panel) will be described. In the drawings, X-axes, Y-axes, and Z-axes may be present. The axes in each drawing correspond to the respective axes in other drawings. Upper sides and the lower sides of FIGS. 4 to 11 correspond to the front side and the rear side of the liquid crystal panel 10.

FIG. 1 is a cross-sectional view schematically illustrating the liquid crystal panel 10. As illustrated in FIG. 1, the liquid crystal panel 10 includes the array substrate 10A, a CF substrate 10B (an opposed substrate), a liquid crystal layer 10C, and a sealant 10D. The CF substrate 10B is opposed to the array substrate 10A. The liquid crystal layer 10C is disposed between the substrates 10A and 10B. The sealant 10D surrounds the liquid crystal layer 10C and seals the liquid crystal layer 10C. Polarizing plates are bonded to outer surfaces of the substrates 10A and 10B, respectively.

Figure 2:
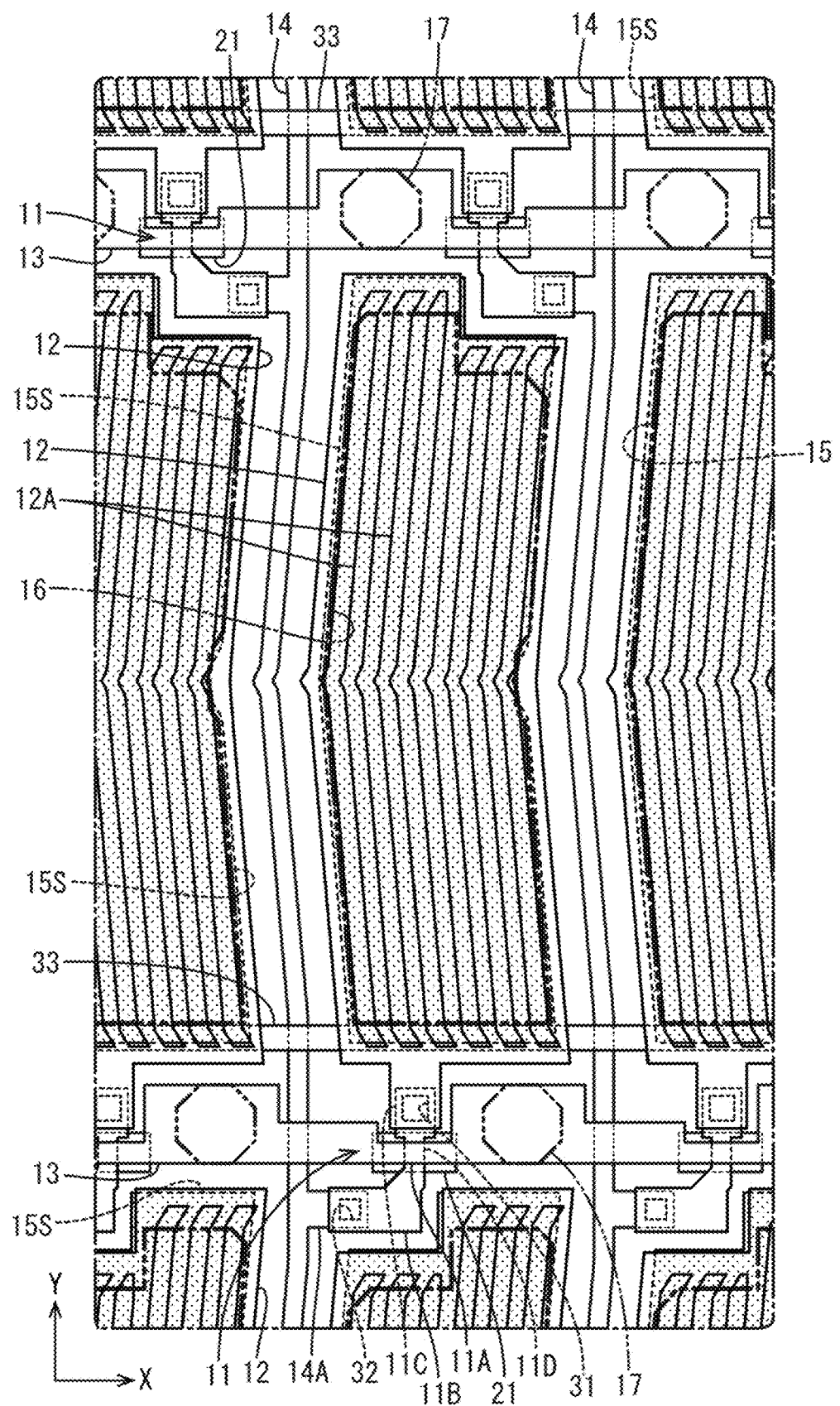
FIG. 2 is a plan view illustrating arrangement of pixels in an array substrate included in the liquid crystal panel.

The liquid crystal panel 10 includes a display surface that includes a display area in which images can be displayed and a non-display area surrounding the display area. FIG. 2 is a plan view illustrating a section of the array substrate 10A in the display area. FIG. 2 includes a section of the CF substrate 10B. As illustrated in FIG. 2, TFTs 11 (switching components, thin film transistors) are arranged in a matrix. Furthermore, pixel electrodes 12 connected to the TFTs 11 are arranged in a matrix. Gate lines 13 (lines, scanning lines) and source lines 14 (second lines, data lines, signal lines) are routed in a grid to surround the TFTs 11 and the pixel electrodes 12. The gate lines 13 extend substantially along the X-axis direction. The source lines 14 extend substantially along the Y-axis direction. The gate lines 13 are connected to gate electrodes 11A of the TFTs 11. The source lines 14 are connected to source regions 11B of the TFTs 11. The pixel electrodes 12 are connected to drain regions 11C of the TFTs 11. The TFTs 11 are driven based on signals supplied through the gate lines 13 and the source lines 14. The application of potentials to the pixel electrodes 12 is controlled following the driving of the TFTs 11. The TFTs 11 are off toward the right or the left in FIG. 2 relative to the pixel electrodes 12 (the source lines 14). The TFTs 11 are repeatedly and alternately arranged on the right relative to the pixel electrodes 12 (the source lines 14) and on the left relative to the pixel electrodes 12 (the source lines 14) with respect to the Y-axis direction. Namely, the TFTs 11 are arranged in zigzags with respect to the Y-axis direction.

As illustrated in FIG. 2, each pixel electrode 12 is disposed in a vertically-long rectangular area defined by the gate lines 13 and the source lines 14. Each pixel electrode 12 bends at the middle of a long dimension thereof (in a long direction). Each pixel electrode 12 is sandwiched between two gate lines from sides with respect the Y-axis direction (the long direction) and between two source lines 14 from sides with respect to the X-axis direction (a short direction). Each pixel electrode 12 includes slits 12A (six slits in FIG. 2) extending in the long direction thereof (the Y-axis direction). The array substrate 10A includes a common electrode 15 to overlap the pixel electrodes 12 in the display area. A substantially constant common potential (a reference potential) is applied to the common electrode 15. The common electrode 15 will be described in detail later. When a potential difference is created between the pixel electrode 12 and the common electrode 15 that overlap each other, a fringe electric field (an oblique electric field) is created at the slits 12A and the fringe electric filed affects the liquid crystal layer 10C. The fringe electric field includes a component along a plate surface of the array substrate 10A and a component normal to the plate surface of the array substrate 10A. Namely, the liquid crystal panel 10 including the array substrate 10A in this embodiment operates in fringe field switching (FFS) mode. The CF substrate 10B includes a black matrix 16 (an inter-pixel light blocking portion) including holes in areas overlapping the pixel electrodes to form a grid. The black matrix 16 is disposed to overlap the TFTs 11, the gate lines 13, and the source lines 14. The CF substrate 10B includes spacers 17 to maintain a thickness of the liquid crystal layer 10C (a cell gap). The spacers are two-dimensionally arranged to overlap sections of the gate lines 13.

Figure 3:
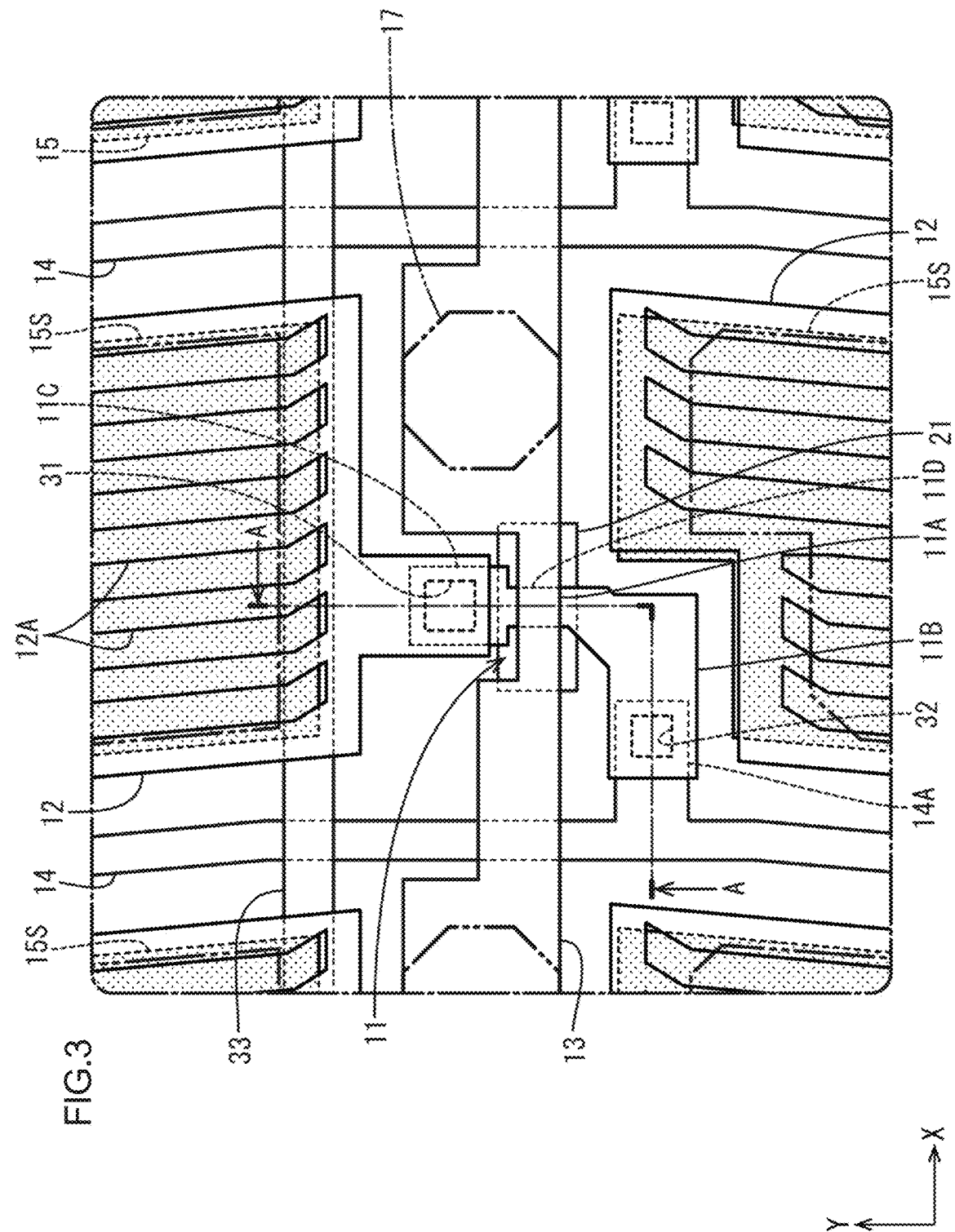
FIG. 3 is a magnified plan view a portion of the array substrate including a TRT and therearound.

FIG. 3 is a plan view illustrating a portion of the array substrate 10A including the TFT 11 and therearound. The configuration of the TFT 11 will be described in detail with reference to FIG. 3. As illustrated in FIG. 3, each TFT 11 is disposed adjacent to the pixel electrode 12 to which the TFT 11 is connected and below the pixel electrode 12 with respect to the Y-axis direction in FIG. 3. The TFTs 11 include gate electrodes 11A that are sections of the gate lines 13. Each gate line 13 includes sections having widths that are different from each other at positions in the X-axis direction. The width of the sections configured as the gate electrodes 11A (intersections crossing channel regions 11D) is the smallest. The TFTs 11 include the source regions 11B (second line connecting portions) connected to the source lines 14. Each source line 14 includes source line branches 14A that branch from sections of the source line 14 crossing the gate lines 13 on opposite sides from the pixel electrodes 12 to be connected with respect to the Y-axis direction. The source line branches 14A extend in the X-axis direction and ends of the source line branches 14A are connected to the source regions 11B. The source line branches 14A are arranged in zigzags to correspond the arrangement of the TFTs 11. The TFTs 11 include the drain regions 11C (pixel connecting portions) disposed with distances from the source regions 11B in the Y-axis direction. The drain regions 11C include ends on an opposite sides from the source regions 11B (the channel region 11D) connected to the pixel electrodes 12. The TFTs 11 include the channel regions 11D overlapping the gate electrodes 11A and being coupled to the source regions 11B and the drain regions 11C. The channel regions 11D extend in the Y-axis direction. First ends and second ends of the channel regions 11D are connected to the source regions 11B and the drain regions 11C, respectively. When the TFTs 11 are driven based on scanning signals supplied to the gate electrodes 11A, image signals (potentials) supplied to the source lines 14 are transmitted to the drain regions 11C via the source regions 11B and the channel regions 11D. As a result, the pixel electrodes 12 are charged to potentials based on the image signals. Light blocking portions 21 are disposed on the rear side of the channel regions 11D of the TFT having the configuration described above with respect to the Z-axis direction, that is, on an opposite side from the gate electrodes 11A to overlap the channel regions 11D. Each light blocking portion 21 has a horizontally-long rectangular shape in a plan view to extend in the X-axis direction (a direction in which the gate lines 13 extend). The light blocking portions 21 are separated from the source lines 14 to form island shapes. The light blocking portions 21 block light toward the channel regions 11D from the rear side. The light may be applied to the liquid crystal panel 10 by a backlight unit for image display. By blocking the light toward the channel regions 11D with the light blocking portions 21, variations in characteristics of the TFTs 11, which may occur when the channel regions 11D are subjected to the light, are less likely to occur.

Figure 4:
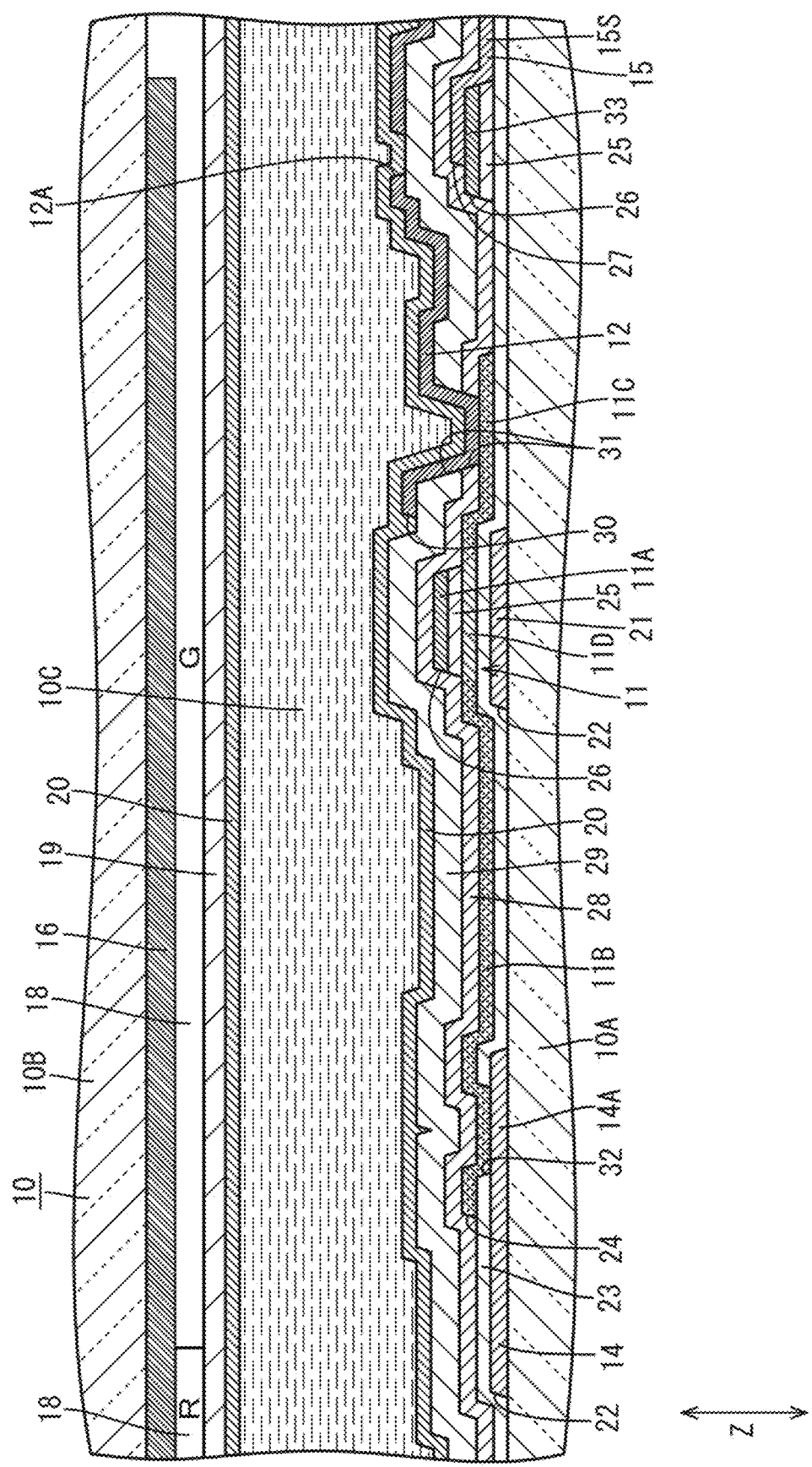
FIG. 4 is a cross-section view of the liquid crystal panel along line A-A in FIG. 3.

FIG. 4 is a cross-sectional view of the liquid crystal panel 10 along line A-A in FIG. 3. As illustrated in FIG. 4, a large number of color filters 18 are disposed at positions opposed to the pixel electrodes 12 in the array substrate 10A to form a matrix in an area of the CF substrate 10B in the display area. The color filters 18 include red (R), green (G), and blue (B) filters are arranged in predefined sequence to form pixels, which are display units, together with the pixel electrodes 12 opposed thereto. The black matrix 16 described earlier is disposed between the adjacent color filter to reduce color mixture. An overcoat film 19 is formed on an inner surface side of the color filters 18 for planarization. The spacers 17 described earlier are formed on an inner surface side of the overcoat film 19. The spacers 17 protrude from the inner surface of the CF substrate 10B in the Z-axis direction toward the array substrate 10A. Ends of the spacers 17 are disposed to contact or adjacent to the innermost surface of the array substrate 10A. Alignment films 20 are formed on the innermost surfaces of the substrates 10A and 10B contacting the liquid crystal layer 10C, respectively, for orientation of liquid crystal molecules included in the liquid crystal layer 10C.

As illustrated in FIG. 4, the array substrate 10A includes various films stacked on an inner surface of a glass substrate (a substrate). The films on the inner surface of the array substrate 10A will be described in detail with reference to FIG. 4. As illustrated in FIG. 4, the array substrate 10A includes a first metal film 22, a first insulator 23 (an inter-line insulator), a semiconductor film 24, a second insulator 25 (an inter-line insulator, a gate insulator), a second metal film 26, a first transparent electrode film 27, a third insulator 28 (an inter-electrode insulator), a fourth insulator 29 (an inter-electrode insulator), a second transparent electrode film 30, and the alignment film 20. The first insulator 23 is disposed in a layer upper than the first metal film 22. The semiconductor film 24 is disposed in a layer upper than the first insulator 23. The second insulator 25 is disposed in a layer upper than the semiconductor film 24. The second metal film 26 is disposed in a layer upper than the second insulator 25. The first transparent electrode film 27 is disposed in a layer upper than the second metal film 26. The third insulator 28 is disposed in a layer upper than the first transparent electrode film 27. The fourth insulator 29 is disposed in a layer upper than the third insulator 28. The second transparent electrode film 30 is disposed in a layer upper than the fourth insulator 29. The alignment film 20 is disposed in a layer upper than the second transparent electrode film 30.

Each of the first metal film 22 and the second metal film 26 has a singly-layer film made of one kind of metal or a multilayer film made of multiple kinds of metals or an alloy to have conductivity and a light blocking property. As illustrated in FIG. 4, the first metal film 22 includes sections that are configured as the source lines 14 and the light blocking portion 21. The second metal film 26 includes sections that are configured as the gate lines 13 and the gate electrodes 11A of the TFTs 11. The semiconductor film 24 is an oxide semiconductor film using an oxide semiconductor as a material. The semiconductor film 24 includes sections that are configured as the source regions 11B, the drain regions 11C, and the channel regions 11D of the TFTs 11. The material of the semiconductor film 24 may be an indium gallium zinc oxide (In—Ga—Zn—O) semiconductor. The In—Ga—Zn—O semiconductor is a ternary oxide containing indium (In), gallium (Ga), and zinc (Zn). In, Ga, and Zn may be contained at a ratio expressed by, but not limited to, In:Ga:Zn=2:2:1, In:Ga:Zn=1:1:1, or In:Ga:Zn=1:1:2. The In—Ga—Zn—O semiconductor may have an amorphous structure or a crystalline structure. When the In—Ga—Zn—O semiconductor having the crystalline structure is used, a crystalline In—Ga—Zn—O semiconductor having a c-axis that is substantially perpendicular to a layer surface is preferable. The first transparent electrode film 27 and the second transparent electrode film 30 are made of a transparent electrode material such as an indium tin oxide (ITO) and an indium zinc oxide (IZO). The semiconductor film 24 includes sections having resistances that are reduced in the production process, that is, the semiconductor film 24 includes the resistance-reduced sections and resistance non-reduced sections. In FIGS. 4 to 11, the resistance reduced sections of the semiconductor are indicated by cross-hatching. The resistivity of the resistance reduced sections of the semiconductor film 24 is significantly small in comparison to the resistance non-reduced sections, for example, about $\frac{1}{10000000000}$ to $\frac{1}{100}$ of the resistivity of the resistance non-reduced sections. Therefore, the resistance reduced sections function as conductors. The resistance reduced sections of the semiconductor film 24 are configured as the source regions 11B and the drain regions 11C of the TFTs 11. In the resistance non-reduced sections of the semiconductor film 24, charge transfer is allowed only under certain conditions (when scanning signals are supplied to the gate electrodes 11A). In the resistance reduced sections, the charge transfer is always allowed and thus the resistance reduced sections function as conductors. The resistance non-reduced sections of the semiconductor film 24 are configured as the channel regions 11D. The first transparent electrode film 27 is configured as the common electrode 15. The second transparent electrode film 30 is configured as the pixel electrodes 12.

The first insulator 23, the second insulator 25, and the third insulator 28 are made of an inorganic insulating material (an inorganic resin material) such as $SiO_2$ (oxide silicon, silicon oxide). The fourth insulator 29 is made of an inorganic insulating material such as SiNx (silicon nitride). The first insulator 23 is disposed between the first metal film 22 and the semiconductor film 24 to the first metal film 22 from the semiconductor film 24. The second insulator 25 is disposed between the semiconductor film 24 and the second metal film 26 to insulate the semiconductor film 24 from the second metal film 26. A distance between each gate electrode 11A and the corresponding channel region 11D is maintained constant with sections of the second insulator 25 overlapping the gate electrodes 11A. The first insulator 23 and the second insulator 25 are disposed at intersections between the source lines 14 prepared from the first metal film 22 and the gate lines 13 prepared from the second metal film 26 to insulate the source lines 14 from the gate lines 13 and thus defined as inter-line insulators. The third insulator 28 covers the semiconductor film 24, the second metal film 26, and the first transparent electrode film 27 from an upper layer side. The fourth insulator 29 covers the third insulator 28 from an upper layer side. The third insulator 28 and the fourth insulator 29 are disposed between the first transparent electrode film 27 and the second transparent electrode film 30 to insulate the first transparent electrode film 27 from the second transparent electrode film 30 to form an inter-electrode insulator. The third insulator 28 and the fourth insulator 29 of the insulators 23, 25, 28, and 29 include pixel electrode contact holes 31 drilled through the third insulator 28 and the fourth insulator 29 at positions at which the drain regions 11C of the TFTs 11 overlap the pixel electrodes 12. Therefore, the drain regions 11C of the TFTs 11 are connected to the pixel electrodes 12 via the pixel electrode contact holes 31. The first insulator 23 includes source line contact holes 32 (second line contact holes) drilled through the first insulator at positions at which the source line branches 14A of the source lines 14 overlap the source regions 11B of the TFTs 11. The source line branches 14A of the source lines 14 are connected to the source regions 11B of the TFTs 11 via the source line contact holes 32.

As illustrated in FIG. 2, the common electrode 15 included in the array substrate 10A in this embodiment includes common electrode segments 15S provided for the pixel electrodes 12, respectively. In FIGS. 2 and 3, areas in which the common electrode 15 is disposed are indicated by hatching. The common electrode segments 15S are arranged in lines in the X-axis direction and in lines in the Y-axis direction to from a matrix. Each line includes multiple common electrode segments 15S. The arrangement of the common electrode segments 15S substantially matches the arrangement of the pixel electrodes 12 in a plan view. The common electrode segments 15S are disposed to overlap the gate lines 13 and the source lines 14. Namely, the common electrode segments 15S that are adjacent to each other in the X-axis direction are separated by the source lines 14. The common electrode segments 15S that are adjacent to each other in the Y-axis direction are separated by the gate lines 13. The common electrode segments do not extend astride the pixel electrodes 12 that are adjacent to each other in the X-axis direction or the Y-axis direction. As illustrated in FIG. 4, the common electrode 15 is prepared from the first transparent electrode film 27 and thus the third insulator 28 and the fourth insulator 29 are disposed between the common electrode 15 and the pixel electrodes 12 that are prepared from the second transparent electrode film 30.

As illustrated in FIG. 2, the array substrate 10A includes common lines 33 for applying a common potential to the common electrode segments 15S that are separated from each other. The common lines 33 extend to cross the common electrode segments 15S. The common lines 33 are connected to the common electrode segments 15S. Specifically, the common lines 33 are prepared from the second metal film 26 from which the gate lines 13 are prepared. The common lines 33 linearly extend in the X-axis direction parallel to the gate lines. The common lines 33 are connected to the common electrode segments 15S that are arranged in the X-axis direction. The common lines 33 are disposed to overlap sections of the common electrode segments 15S.

More specifically, the common lines 33 are disposed at a position away from the pixel electrode contact holes 31 in the Y-axis direction on an opposite side from the TFTs 11. The common lines 33 overlap the ends of the common electrode segments 15S on the TFTs 11 side with respect to the Y-axis direction. In the array substrate 10A, the second metal film 26 from which the common lines 33 are prepared and the first transparent electrode film 27 from which the common electrode 15 is prepared are disposed on top of each other without an insulator therebetween in the production. Therefore, sections of the first transparent electrode film 27 overlapping sections of the second metal film 26 are directly stacked on the section of the second metal film 26. As illustrated in FIG. 4, the common electrode segments 15S are directly stacked on the common lines 33 and electrically connected to the common lines 33. The number of the common lines 33 is equal to the number of the pixel electrodes 12 in one line along the Y-axis direction. The common electrode segments 15S connected to the common lines 33 are separated from each other and provided for the respective pixel electrodes 12. The common electrode segments 15S are disposed not to overlap the gate lines 13 connected to the TFTs 11. Therefore, connection of the common electrode segments 15S to the common lines 33 can be designed with flexibility. Because the common lines 33 and the gate lines 13 are both prepared from the second metal film 26 as described earlier, if a common electrode formed in a solid pattern to straddle the pixel electrodes 12 is used, an insulator may be required between the common electrode and the gate lines 13 so that a shot circuit is less likely to occur between the common electrode and the gate lines 13. Contact holes may be required in the insulator to connect the common lines 33 to the common electrode. Because the common electrode 15 includes the common electrode segments 15S that are directly disposed on the common lines 33 and connected to the common lines 33, the configuration that requires the insulator between the common electrode and the gate lines 13 is not required. According to the configuration, the number of photomasks including the photomask 50 (see FIG. 5) required in the production can be reduced.

The liquid crystal panel 10 according to this embodiment has the configuration described above. Next, a method of producing the liquid crystal panel 10 will be described. The liquid crystal panel 10 according to this embodiment is prepared by bonding the array substrate 10A and the CF substrate 10B together. The array substrate 10A and the CF substrate 10B are prepared separately. A method of producing the array substrate 10A included in the liquid crystal panel 10 will be described in detail.

The method of producing the array substrate 10A includes a first metal film forming step, a first insulator forming step, a semiconductor film forming step, a second metal film and second insulator forming step, a first transparent electrode forming step, a third insulator and fourth insulator forming step, and a second transparent electrode film forming step. The first metal film forming step includes forming and patterning the first metal film 22. The first insulator forming step includes forming and patterning the first insulator 23. The semiconductor film forming step includes forming and patterning the semiconductor film 24. The second metal film and second insulator forming step includes consecutively forming and patterning the second insulator 25 and the second metal film 26. The first transparent electrode film forming step includes forming and patterning the first transparent electrode film 27. The third insulator and fourth insulator forming step includes consecutively forming and patterning the third insulator 28 and the fourth insulator 29. The second transparent electrode film forming step includes forming and patterning the second transparent electrode film 30.

Figure 5:
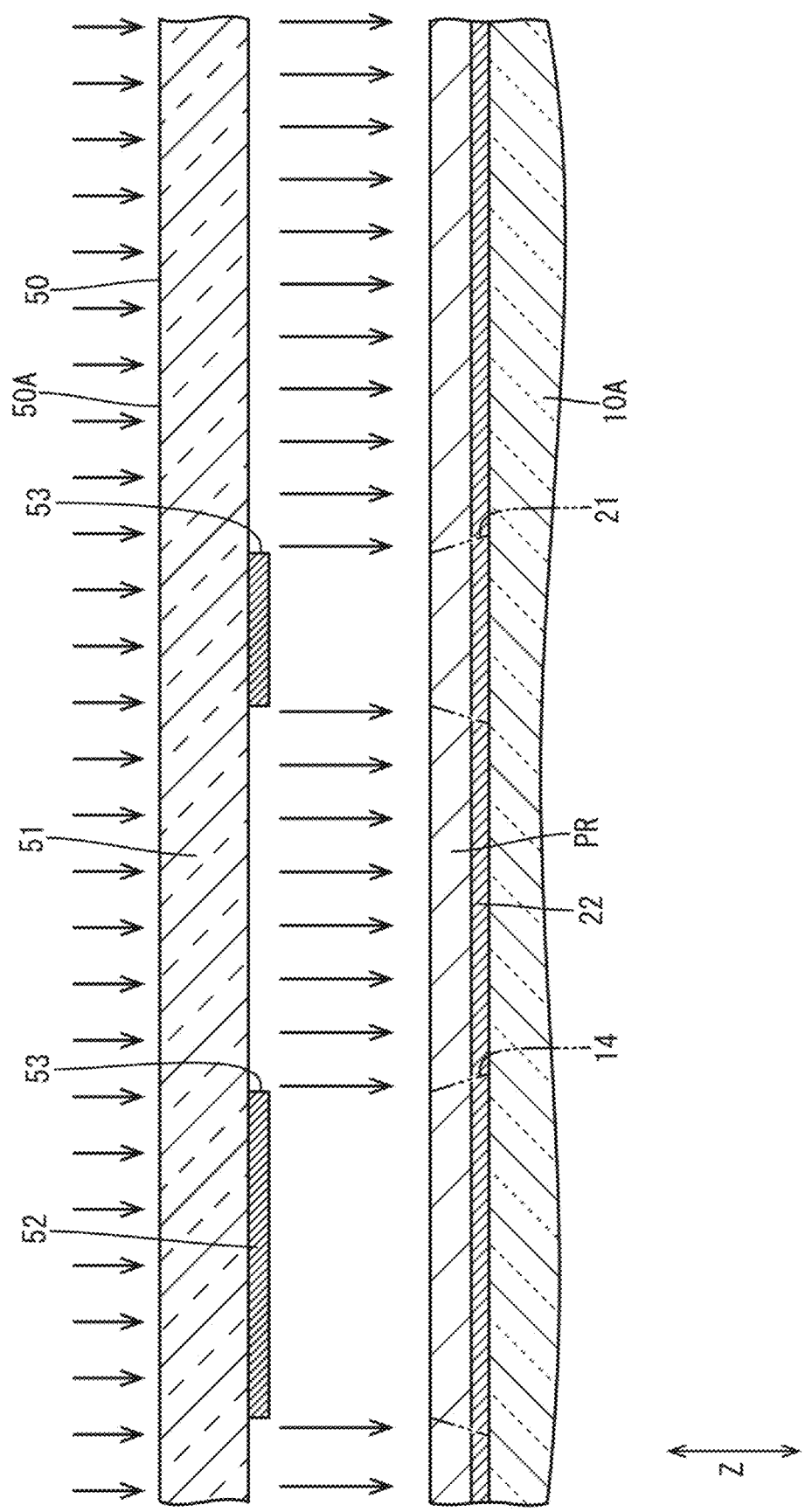
FIG. 5 is a cross-sectional view along line A-A in FIG. 3 illustrating a photoresist film exposed in a first metal film forming step in a method of producing the array substrate.

In the steps, photoresist films PR made of a photosensitive material are overlaid on the films to be patterned and partially exposed using an exposure device and the photomasks 50. The photomasks 50 used in the steps have a common structure described below. As illustrated in FIG. 5, each photomask 50 includes a transparent substrate 51 and a light blocking film 52. The substrate 51 has sufficiently high light transmissivity. The light blocking film 52 is formed on a plate surface of the substrate 51. The light blocking film 52 blocks exposure light from a light source in the exposure device. The light blocking film 52 includes holes 53. The photomask 50 includes light blocking areas in which the light blocking film is formed to block the light and light passing areas in which the holes 53 are formed (areas in which the light blocking film 52 is not formed) to pass the light. The photomasks 50 include a first photomask 50A used in the first metal film forming step, a second photomask 50B used in the first insulator forming step, a third photomask 50C used in the semiconductor film forming step, a fourth photomask 50D used in the second metal film and second insulator forming step, a fifth photomask 50E used in the first transparent electrode film forming step, a sixth photomask 50F used in the third insulator and fourth insulator forming step, and a seventh photomask 50G used in the second transparent electrode film forming step. The alphabets may be omitted when features apply to all are described. The steps will be described in sequence with reference to FIGS. 5 to 11.

As illustrated in FIG. 5, in the first metal film forming step, the first metal film 22 is formed on a surface of the glass substrate to be included in the array substrate 10A and then the photoresist film PR made of a positive photosensitive material is formed. Then, the photoresist film PR is exposed using the exposure device and the first photomask 50A. The first photomask 50A includes the light blocking film 52 in a pattern that corresponds to areas in which the source lines 14 and the light blocking portions 21 are to be formed. When the exposed photoresist film PR is developed and the exposed sections are removed, only the areas of the first metal film 22 in which the source lines 14 and the light blocking portions 21 are to be formed are covered with the photoresist film PR. By etching the first metal film 22 with the photoresist film PR, sections of the first metal film 22 not covered with the photoresist film PR are removed. By ashing the photoresist film PR or removing the photoresist film PR using a remover, the first metal film 22 is patterned and the source lines 14 and the light blocking portions 21 are formed.

Figure 6:
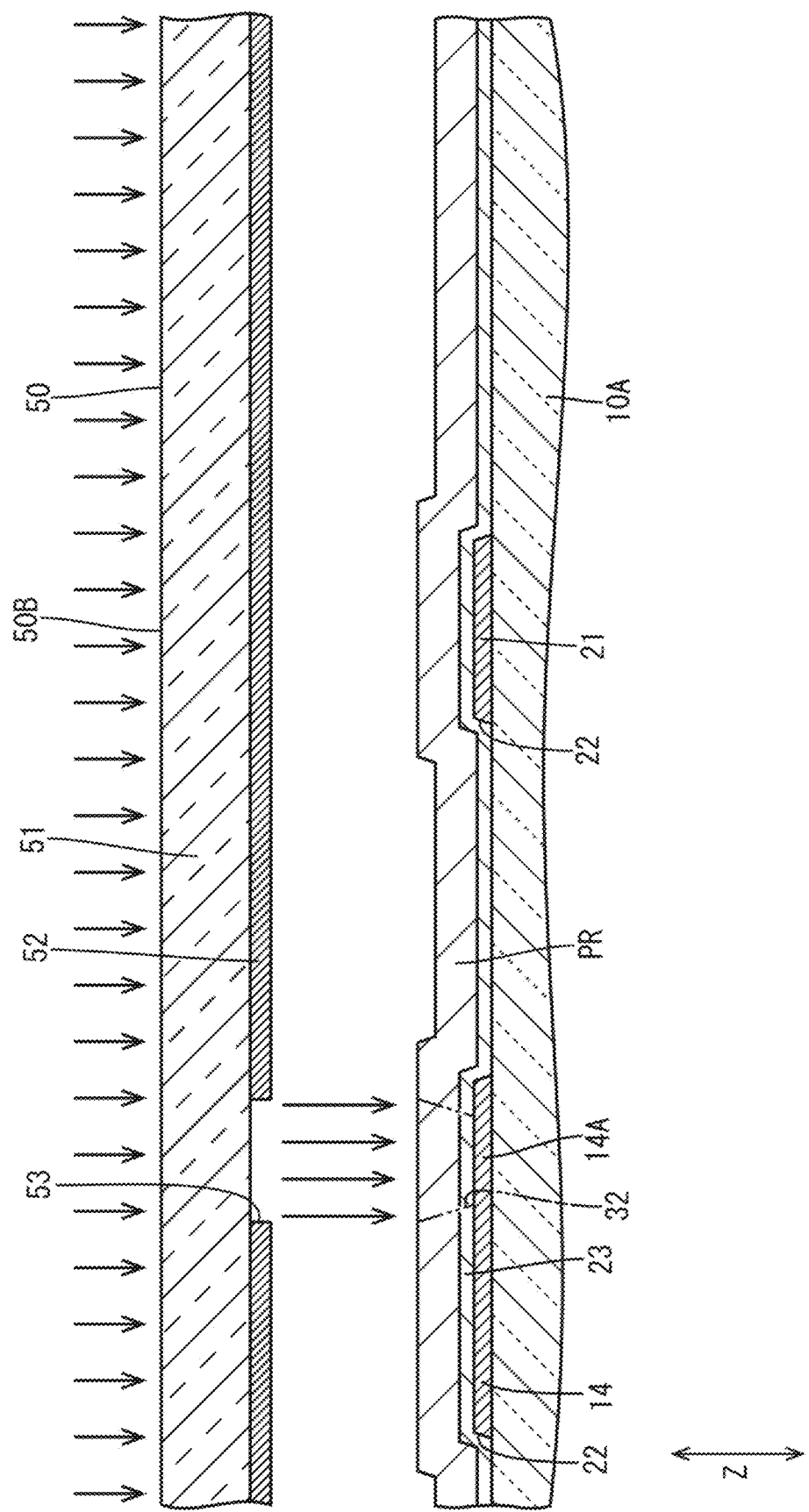
FIG. 6 is a cross-sectional view along line A-A in FIG. 3 illustrating the photoresist film exposed in a first insulator forming step in the method of producing the array substrate.

As illustrated in FIG. 6, in the first insulator forming step, the first insulator 23 is formed on a surface of the glass substrate and the first metal film 22 and then the photoresist film PR made of a positive photosensitive material is formed. Then, the photoresist film PR is exposed using the exposure device and the second photomask 50B. The second photomask 50B includes the holes 53 arranged in a pattern that corresponds to areas in which the source line contact holes 32 are to be formed. When the exposed photoresist film PR is developed and the exposed sections are removed, only the areas of the first insulator 23 in which the source line contact holes 32 are to be formed are covered with the photoresist film PR. By etching the first insulator 23 with the photoresist film PR, sections of the first insulator 23 not covered with the photoresist film PR are removed. By ashing the photoresist film PR or removing the photoresist film PR using a remover, the first insulator 23 is patterned and the source line contact holes 32 are formed.

Figure 7:
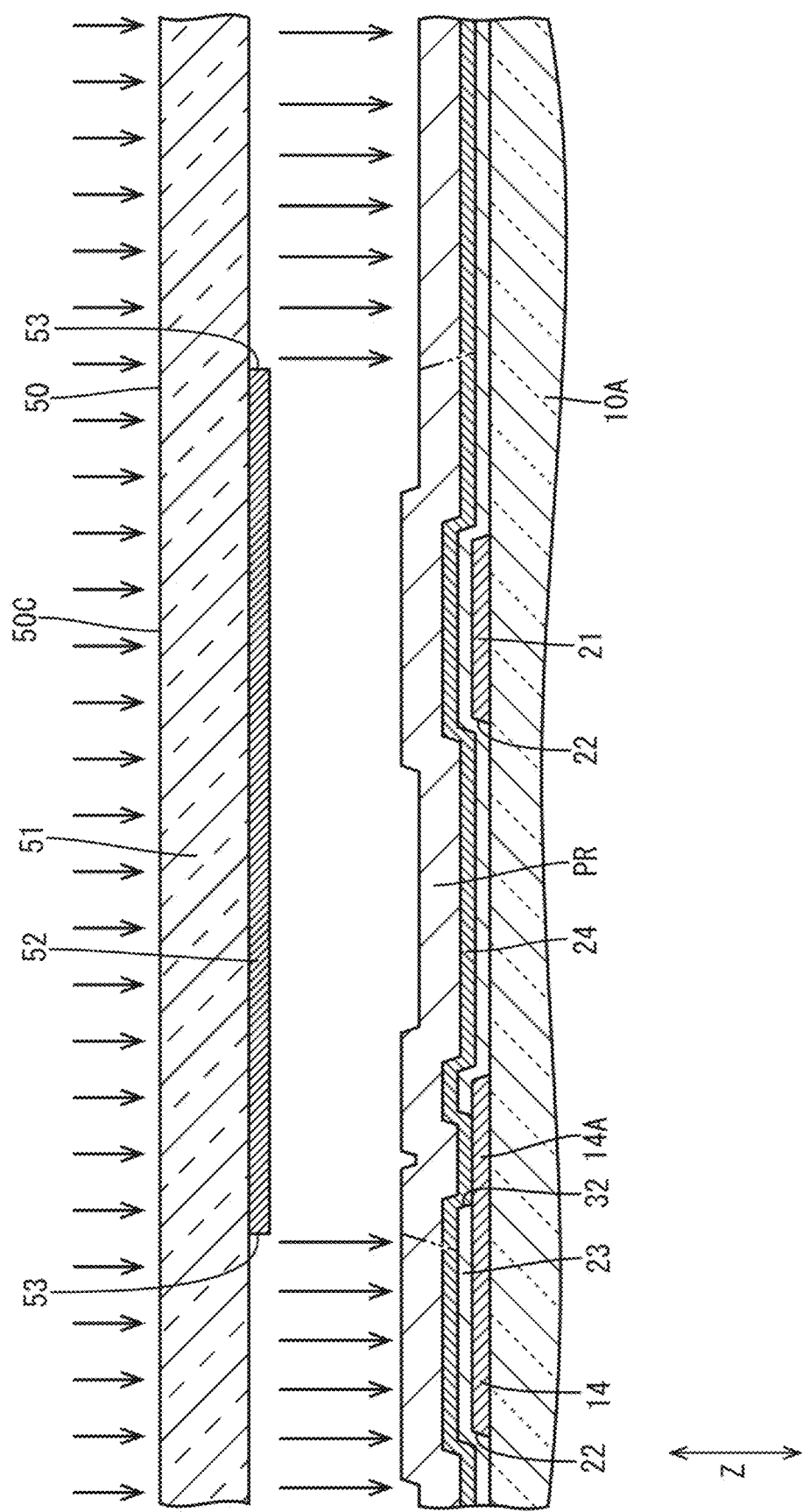
FIG. 7 is a cross-sectional view along line A-A in FIG. 3 illustrating the photoresist film exposed in a semiconductor film forming step in the method of producing the array substrate.

As illustrated in FIG. 7, in the semiconductor film forming step, the semiconductor film 24 is formed on a surface of the first insulator 23 and then the photoresist film PR made of a positive photosensitive material is formed. Then, the photoresist film PR is exposed using the exposure device and the third photomask 50C. The third photomask 50C includes the light blocking film 52 in a pattern that corresponds to areas in which the source regions 11B, the drain regions 11C, and the channel regions 11D are to be formed. When the exposed photoresist film PR is developed and the exposed sections are removed, only the areas of the semiconductor film 24 in which the source regions 11B, the drain regions 11C, and the channel regions 11D are to be formed are covered with the photoresist film PR. By etching the semiconductor film 24 with the photoresist film PR, sections of the semiconductor film 24 not covered with the photoresist film PR are removed. By ashing the photoresist film PR or removing the photoresist film PR using a remover, the semiconductor film 24 is patterned and the source regions 11B, the drain regions 11C, and the channel regions 11D are formed. At this moment, an entire area of the semiconductor film 24 is a resistance non-reduced area.

Figure 8:
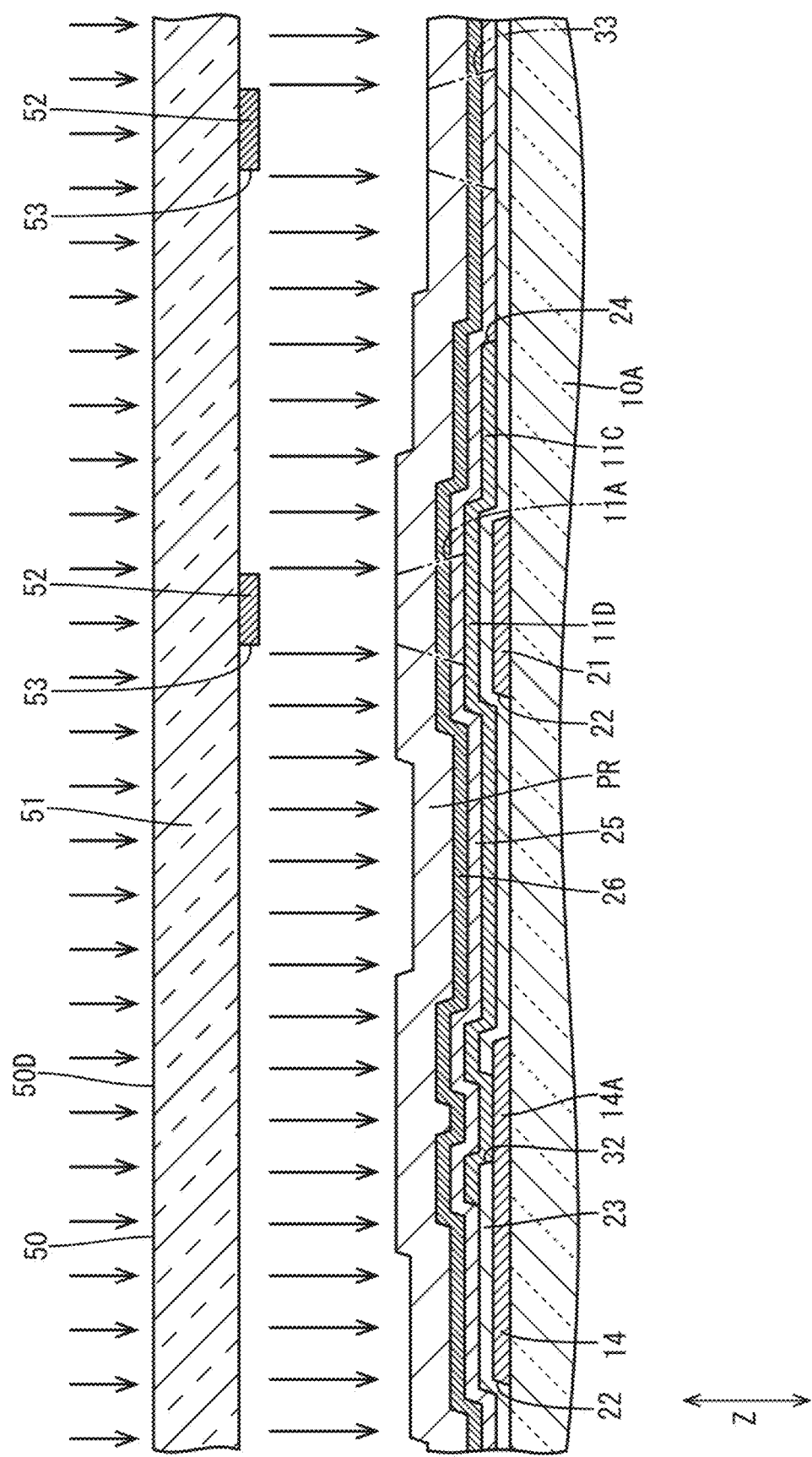
FIG. 8 is a cross-sectional view along line A-A in FIG. 3 illustrating the photoresist film exposed in a second metal film and a second insulator forming step in the method of producing the array substrate.

As illustrated in FIG. 8, in the second metal film and second insulator forming step, the second insulator 25 is formed on a surface of the first insulator 23 and the semiconductor film 24, the second metal film 26 is formed, and then the photoresist film PR made of a positive photosensitive material is formed. Then, the photoresist film PR is exposed using the exposure device and the fourth photomask 50D. The fourth photomask 50D includes the light blocking film 52 in a pattern that corresponds to areas in which the gate electrodes 11A and the common lines 33 are to be formed. When the exposed photoresist film PR is developed and the exposed sections are removed, only the areas of the second metal film 26 in which the gate electrodes 11A and the common lines 33 are to be formed are covered with the photoresist film PR. By etching the second metal film 26 with the photoresist film PR, sections of the second metal film 26 not covered with the photoresist film PR are removed. At the same time, sections of the second insulator 25 disposed in a layer lower than the second metal film 26 not covered with the photoresist film PR are removed. By ashing the photoresist film PR or removing the photoresist film PR using a remover, the second insulator 25 and the second metal film are patterned at the same time and the gate electrodes 11A and the common lines 33 are formed. Between completion of the second metal film and second insulator step and a start of the first transparent electrode forming step, a resistance reducing process is performed to reduce resistances of the sections of the semiconductor film 24. The resistance reducing process is performed on remaining sections of the semiconductor film 24 exposed to the front side, that is, sections (the source regions 11B and the drain regions 11C) that do not overlap remaining sections of the second insulator 25 and the second metal film 26 (the gate electrodes 11A). Plasma processing using $NH_3$, $N_2$, or He gas may be preferable for the resistance reducing process. Through the resistance reducing process, the source regions 11B and the drain regions 11C among the remaining sections of the semiconductor film 24 are configured as the resistance reduced sections but the channel regions 11D remain as the resistance non-reduced sections.

Figure 9:
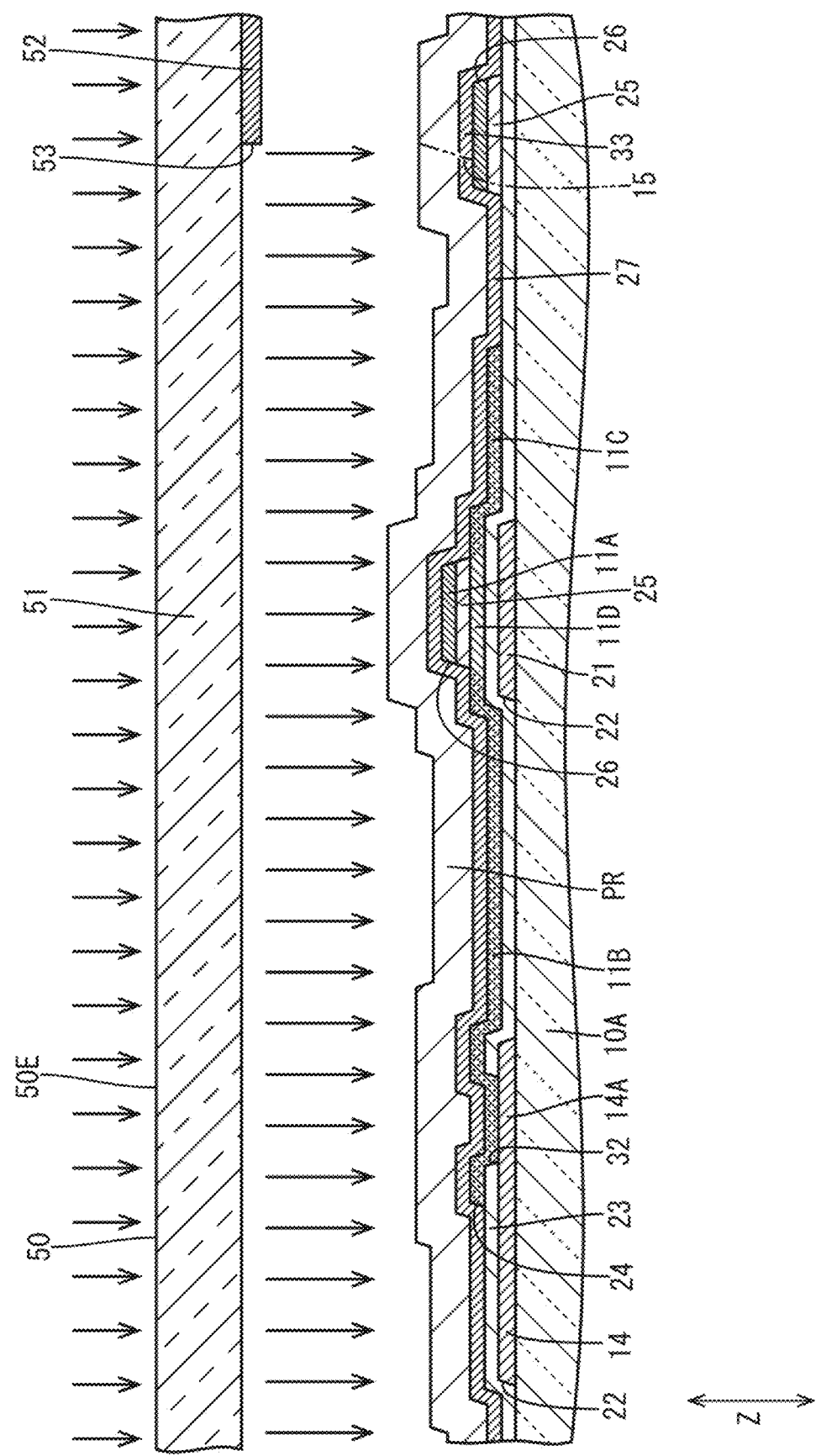
FIG. 9 is a cross-sectional view along line A-A in FIG. 3 illustrating the photoresist film exposed in a first transparent electrode film forming step in the method of producing the array substrate.

As illustrated in FIG. 9, in the first transparent electrode film forming step, the first transparent electrode film 27 is formed on surfaces of the semiconductor film 24 and the second metal film 26 and then the photoresist film PR made of a positive photosensitive material is formed. Then, the photoresist film PR is exposed using the exposure device and the fifth photomask 50E. The fifth photomask 50E includes the light blocking film 52 in a pattern that corresponds to areas in which the common electrode 15 is to be formed. When the exposed photoresist film PR is developed and the exposed sections are removed, only the areas of the first transparent electrode film 27 in which the common electrode 15 are to be formed are covered with the photoresist film PR. By etching the first transparent electrode film 27 with the photoresist film PR, sections of the first transparent electrode film 27 not covered with the photoresist film PR are removed. By ashing the photoresist film PR or removing the photoresist film PR using a remover, the first transparent electrode film 27 is patterned and the common electrode 15 is formed.

Figure 10:
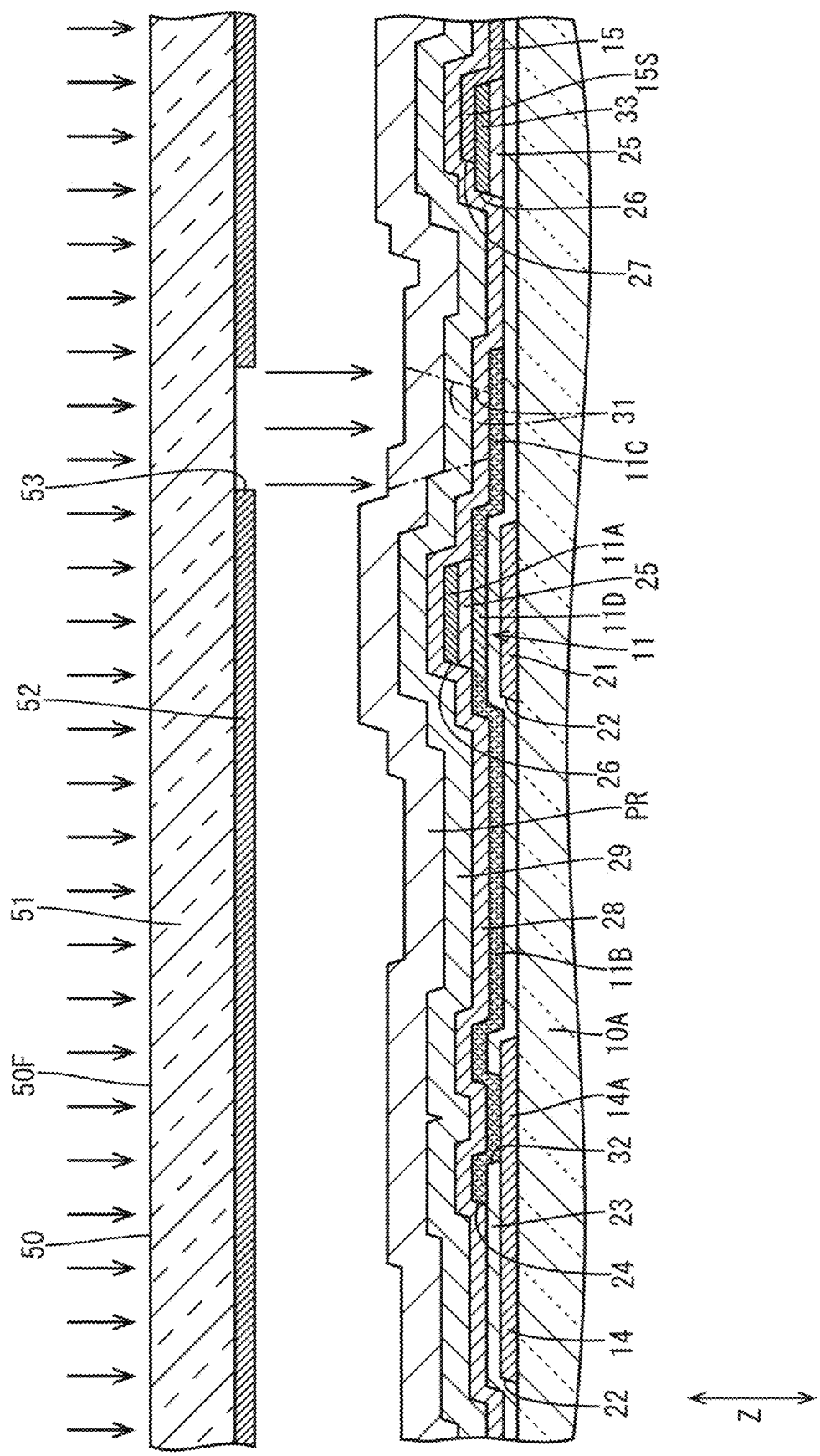
FIG. 10 is a cross-sectional view along line A-A in FIG. 3 illustrating the photoresist film exposed in a third insulator and forth insulator forming step in the method of producing the array substrate.

As illustrated in FIG. 10, in the third insulator and fourth insulator forming step, the third insulator 28 is formed on surfaces of the semiconductor film 24, the second metal film 26, and the first transparent electrode film 27 and then the fourth insulator 29 is formed. Further, the photoresist film PR made of a positive photosensitive material is formed. Then, the photoresist film PR is exposed using the exposure device and the sixth photomask 50F. The sixth photomask 50F includes the holes 53 arranged in a pattern that corresponds to areas in which the pixel electrode contact holes 31 are to be formed. When the exposed photoresist film PR is developed and the exposed sections are removed, only the areas of the fourth insulator 29 in which the pixel electrode contact holes 31 are to be formed are covered with the photoresist film PR. By etching the fourth insulator 29 with the photoresist film PR, sections of the fourth insulator 29 not covered with the photoresist film PR are removed. At the same time, sections of the third insulator 28, which is disposed in the layer lower than the fourth insulator 29, not covered with the photoresist film PR are removed. By ashing the photoresist film PR or removing the photoresist film PR using a remover, the third insulator 28 and the fourth insulator 29 are patterned and the pixel electrode contact holes 31 are formed.

Figure 11:
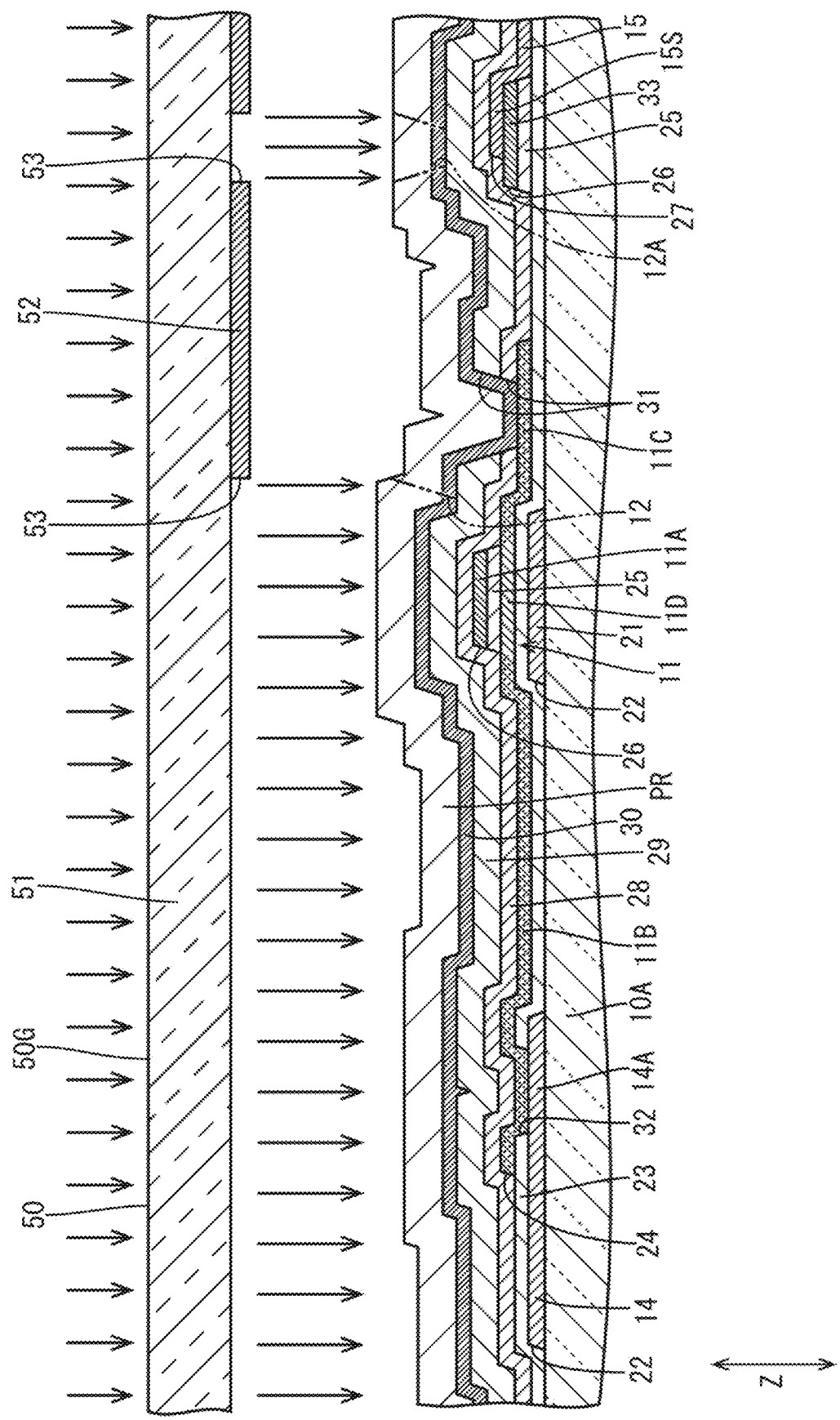
FIG. 11 is a cross-sectional view along line A-A in FIG. 3 illustrating the photoresist film exposed in a second transparent electrode film forming step in the method of producing the array substrate.

As illustrated in FIG. 11, in the second transparent electrode film forming step, the second transparent electrode film 30 is formed on a surfaces of the fourth insulator 29 and then the photoresist film PR made of a positive photosensitive material is formed. Then, the photoresist film PR is exposed using the exposure device and the seventh photomask 50G. The seventh photomask 50G includes the light blocking film 52 in a pattern that corresponds to areas in which the pixel electrodes 12 is to be formed. When the exposed photoresist film PR is developed and the exposed sections are removed, only the areas of the second transparent electrode film 30 in which the pixel electrodes 12 are to be formed are covered with the photoresist film PR. By etching the second transparent electrode film 30 with the photoresist film PR, sections of the second transparent electrode film 30 not covered with the photoresist film PR are removed. By ashing the photoresist film PR or removing the photoresist film PR using a remover, the second transparent electrode film 30 is patterned and the pixel electrodes 12 are formed.

As described above, in this embodiment, the first transparent electrode film forming step is performed after the second metal film and second insulator forming step is performed. The common electrode segments 15S included in the common electrode 15 prepared from the first transparent electrode film 27 are directly stacked on the common lines 33 prepared from the second metal film 26 and electrically connected to the common lines 33. According to a known technology, a common electrode prepared from the first transparent electrode film 27 is formed in a solid pattern to extend for an entire display area. In such a configuration, an insulator is required between the second metal film 26 and the first transparent electrode film 27 so that a short circuit is less likely to occur between the common electrode and the gate lines 13 prepared from the second metal film 26. Further, contact holes are required in the insulator to connect the common lines 33 to the common electrode. A photomask exclusively designed for the patterning of the insulator is required. Namely, eight photomasks are required for the production of the array substrate. In this embodiment, the insulator is not disposed between the second metal film 26 and the first transparent electrode film 27 and thus the photomask for the patterning of the insulator is not required. Therefore, the array substrate 10A can be produced with seven photomasks 50, that is, the number of photomasks 50 is reduced by one in comparison to the known technology.

As described above, the array substrate 10A in this embodiment includes the pixel electrodes 12, the TFTs 11 (the switching components), the gate lines 13 (the lines), the common electrode 15, and the common lines 33. The TFTs 11 are connected to the pixel electrodes 12, respectively. The gate lines 13 are connected to the TFTs 11. The common electrode 15 includes the common electrode segments 15S separately provided for the respective pixel electrodes 12. The common electrode segments 15S overlap at least sections of the pixel electrode 12 via the third insulator 28 and the fourth insulator 29 but do not overlap the gate lines 13. The third insulator 28 and the fourth insulator 29 form the inter-electrode insulator. The common lines 33 are prepared from the second metal film 26 (the conductive film) from which the gate lines 13 are prepared. The common lines 33 extend to straddle the common electrode segments 15S. The common lines 33 are connected to the common electrode segments 15S.

When the TFTs 11 are driven based on the signals supplied through the gate lines 13, the pixel electrodes 12 are charged to predefined potentials, respectively. The common potential is applied to the common electrode segments 15S in the common electrode 15 via the common lines 33 that extend to straddle the common electrode segments 15S. The common electrode segments 15S are disposed to overlap the pixel electrodes 12 via the third insulator 28 and the fourth insulator 29 that form the inter-electrode insulator. Therefore, potential differences may be created between the pixel electrodes 12 and the common electrode segments 15S based on the potentials at the pixel electrodes 12 and electric fields may be created between the pixel electrodes 12 and the common electrode segments 15S.

The common lines 33 are prepared from the second metal film 26 from which the gate lines 13 are prepared. The same photomask 50 is used for the patterning in the production. In comparison to a configuration in which common lines are made of a material different from that of the gate lines 13, the number of the photomasks 50 required in the production can be reduced. The common electrode segments 15S connected to the common lines 33 are separately provided for the respective pixel electrodes 12 and disposed not to overlap the gate lines 13 connected to the TFTs 11. Therefore, connection of the common electrode segments 15S to the common lines 33 can be designed with flexibility. Because the common lines 33 and the gate lines 13 are both prepared from the second metal film 26 as described earlier, if a common electrode formed in a solid pattern to straddle the pixel electrodes 12 is used, an insulator may be required between the common electrode and the gate lines 13 so that a shot circuit is less likely to occur between the common electrode and the gate lines 13. Contact holes may be required in the insulator to connect the common lines 33 to the common electrode. According to the common electrode 15 including the common electrode segments 15S, the common electrode segments 15S can be connected to the common lines 33 without the insulator between the common electrode and the gate lines 13. Therefore, the number of the photomask 50 required in the production can be further reduced.

The common electrode segments 15S are disposed to partially and directly overlap the common lines 33. According to the configuration, an insulator is not disposed between the common lines 33 and the common electrode segments 15S. Therefore, formation and patterning of the insulator are not required and thus the number of the photomasks 50 required for the production can be reduced.

The common electrode 15 is disposed in the layer lower than the pixel electrodes 12 with the third insulator 28 and the fourth insulator 29 between the common electrode 15 and the pixel electrodes 12. The third insulator 28 and the fourth insulator 29 form the inter-electrode insulator. The source lines 14 (the second lines) are connected to the TFTs 11 and disposed in the layer lower than the gate lines 13 with the first insulator 23 and the second insulator 25 between the gate lines 13 and the source lines 14. The TFTs 11 includes the source regions 11B (the second line connecting portions) disposed to overlap sections of the source lines 14 and connected to the source lines 14 via the source line contact holes 32 (the second line contact holes) drilled through the first insulator 23 that is the inter-line insulator. The source regions 11B are prepared from the semiconductor film 24. According to the configuration, the gate lines 13 are insulated from the source lines 14 by the first insulator 23 and the second insulator 25 that are inter-line insulator. The signals transmitted through the source lines 14 are transmitted to the source regions 11B via the source line contact holes 32 drilled through the first insulator 23 that is the inter-line insulator. In the production, the source line contact holes 32 are formed by partially etching the first insulator 23 that is the inter-line insulator. The etching is independently performed from the etching of other insulators and thus the source regions 11B that is prepared from the semiconductor film 24 that is a base is less likely to be over-etched.

The common electrode 15 is disposed in the layer lower than the pixel electrodes 12 with the third insulator 28 and the fourth insulator 29 between the common electrode 15 and the pixel electrodes 12. The third insulator 28 and the fourth insulator 29 are the inter-electrode insulator. The source lines 14 are connected to the TFTs 11 and disposed in the layer lower than the gate lines 13 with the first insulator 23 and the second insulator 25 between the gate lines 13 and the source lines 14. Each TFT 11 includes the source region 11B connected to the source line 14, the drain region 11C connected to the pixel electrode 12, and the channel region 11D including the first end connected to the source region 11B and the second end connected to the drain regions 11C. The channel region 11D is prepared from the semiconductor film 24. The light blocking portions 21 are disposed in the layer lower than the first insulator 23 to overlap the first insulator 23. The first insulator 23 is the inter-line insulator. The light blocking portions 21 are prepared from the first metal film 22 (the conductive film) from which the source lines 14 are prepared. According to the configuration, the gate lines 13 are insulated from the source lines 14 by the first insulator 23 and the second insulator 25 that are disposed between the gate lines 13 and the source lines 14. The first insulator 23 and the second insulator 25 are the inter-line insulators. The signals transmitted through the source lines 14 are transmitted to the source regions 11B, the channel regions 11D, and the drain regions 11C. With the light blocking portions 21 disposed to overlap the channel regions 11D that are prepared from the semiconductor film 24 from the lower layer via the first insulator 23 that is the inter-line insulator, light from the lower layer toward the channel regions 11D can be blocked by the light blocking portions 21. According to the configuration, variations in characteristics of the TFTs 11, which may be caused by the light reached the channel regions 11D, can be reduced. Because the source lines 14 and the light blocking portions 21 are both prepared from the first metal film 22, the same photomask 50 can be used for the patterning to form the source lines 14 and the light blocking portions 21. This configuration is preferable for reducing the number of photomasks 50 used in the production.

The liquid crystal panel 10 (the display device) in this embodiment includes the array substrate 10A described above and the CF substrate 10B (the opposed substrate) opposed to the array substrate 10A. According to the liquid crystal panel 10, the number of the photomasks 50 required in the production of the array substrate 10A is reduced and thus the production cost can be reduced.

Second Embodiment

A second embodiment will be described with reference to FIGS. 12 to 17. The second embodiment includes TFTs 111 having a configuration different from that of the first embodiment. Components, functions, and effects similar to those of the first embodiment previously described will not be described.

Figure 12:
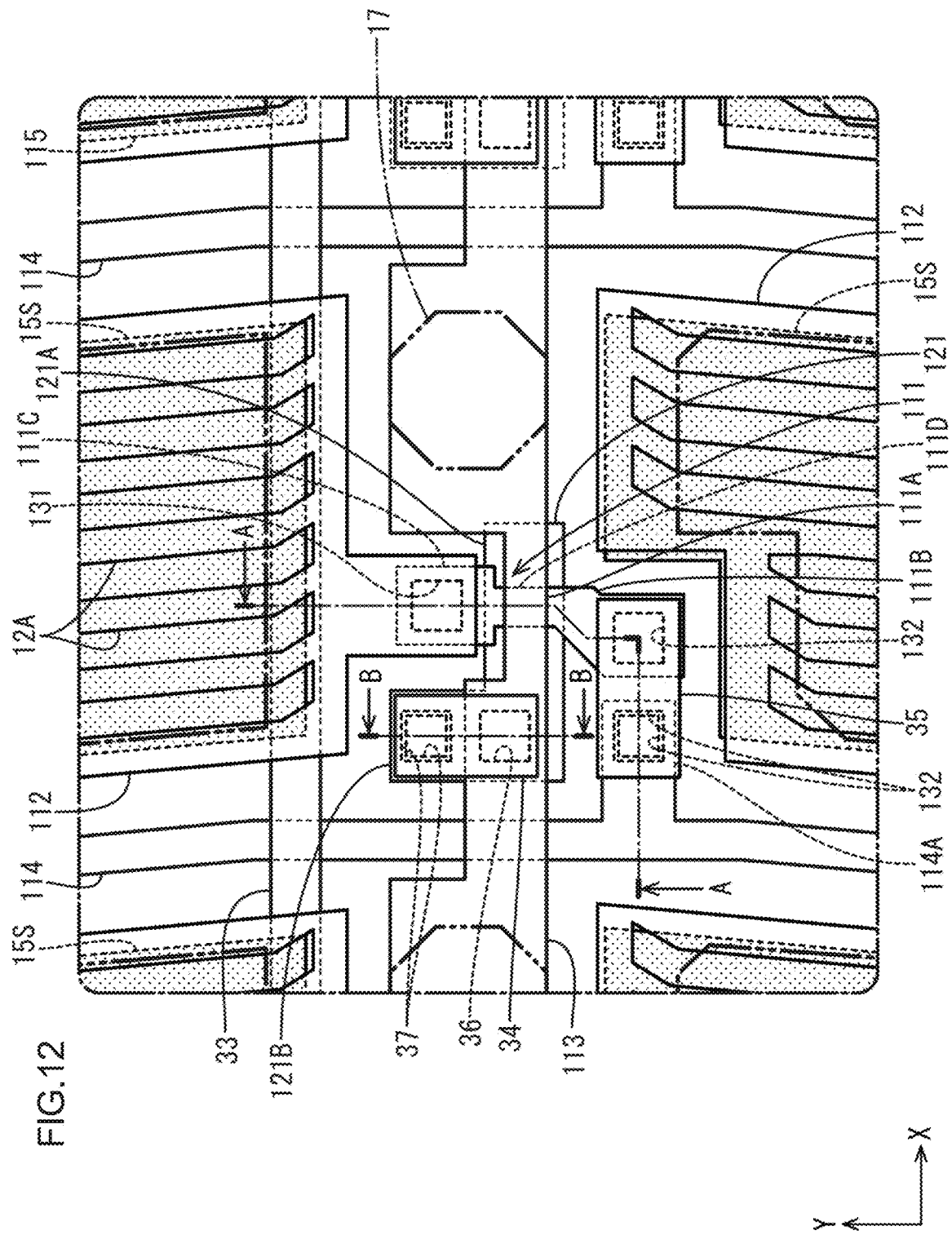
FIG. 12 is a magnified plan view illustrating a portion of an array substrate including a TFT and therearound according to a second embodiment.

As illustrated in FIG. 12, gate electrodes 111A of the TFTs 111 in this embodiment are connected to light blocking portions 121 via gate connecting electrodes 34. Source regions 111B are connected to source lines 114 via source line connecting electrodes 35 (the second line connecting electrodes). The gate connecting electrodes 34 and the source line connecting electrodes 35 are prepared from a second transparent electrode film 130 from which pixel electrodes 112 are prepared. Connections regarding the gate connecting electrodes 34 and the source line connecting electrodes 35 will be described in sequence.

Figure 13:
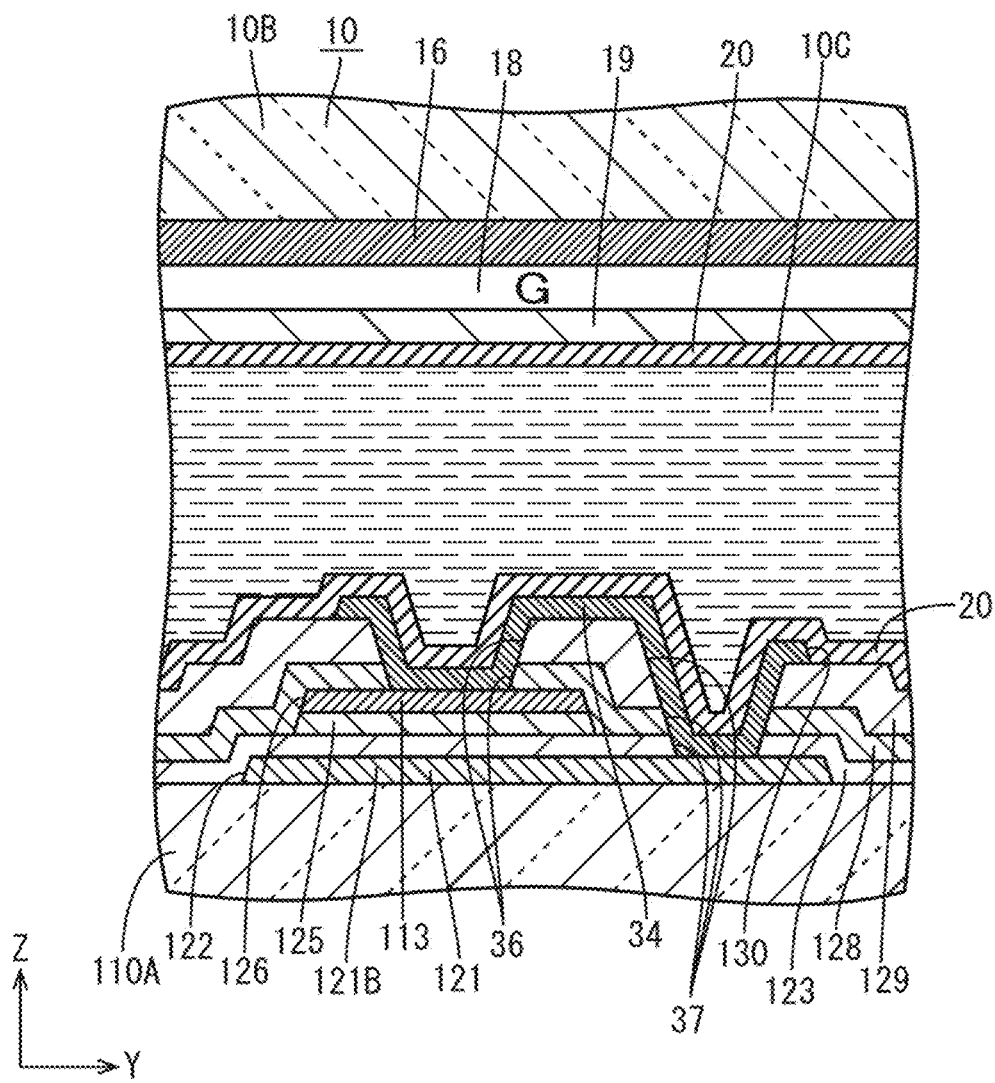
FIG. 13 is a cross-sectional view of a liquid crystal panel along line B-B in FIG. 12.

As illustrated in FIG. 12, the light blocking portions 121 include main light blocking portions 121A and connecting portions 121B. The main light blocking portions 121A overlap channel regions 111D of the TFTs 111. The connecting portions 121B are coupled to the main light blocking portions 121A. The main light blocking portions 121A are similar to the light blocking portions 21 in the first embodiment. Each connecting portion 121B includes portions having a vertically-long rectangular shape in a plan view to extend in the Y-axis direction (a direction in which the source lines 114 extend) and sections disposed between the gate lines 113 and the pixel electrodes 112 with respect to the Y-axis direction and not to overlap the gate lines 113. The gate connecting electrodes 34 have a vertically-long rectangular shape to extend in the Y-axis direction in a plan view. The gate connecting electrodes 34 are disposed to overlap about entire areas of the connecting portions 121B and sections of the gate lines 113. As illustrated in FIG. 13, sections of a third insulator 128 and a fourth insulator 129 overlapping the gate lines 113 and the gate connecting electrodes 34 include gate contact holes 36 drilled through the third insulator 128 and the fourth insulator 129 for connecting the gate lines 113 to the gate connecting electrodes 34. Portions of a first insulator 123, the third insulator 128, and the fourth insulator 129 overlapping the gate connecting electrodes 34 and sections of the connecting portions 121B of the light blocking portions 121 not overlapping the gate lines 113 include light blocking portion contact holes 37 drilled through the insulators 123, 128, and 129. The light blocking portion contact holes 37 are provided for connecting the gate connecting electrodes 34 to the sections of the connecting portions 121B of the light blocking portions 121 not overlapping the gate lines 113. The gate connecting electrodes 34 prepared from the second transparent electrode film 130 are connected to the gate lines 113 prepared from a second metal film 126 via the gate contact holes 36 and to the connecting portions 121B of the light blocking portions 121 prepared from a first metal film 122 via the light blocking portion contact holes 37. The scanning signals transmitted through the gate lines 113 are supplied to the light blocking portions 121 via the gate connecting electrodes 34 at the same timing with the gate electrodes 111A. The light blocking portions 121 in this embodiment functions as second gate electrodes, that is, the TFTs 111 have a double-gate structure. In the TFTs 111 having the double-gate structure, an amount of charge transfer between the source regions 111B and drain regions 111C via the channel regions 111D is large.

Figure 14:
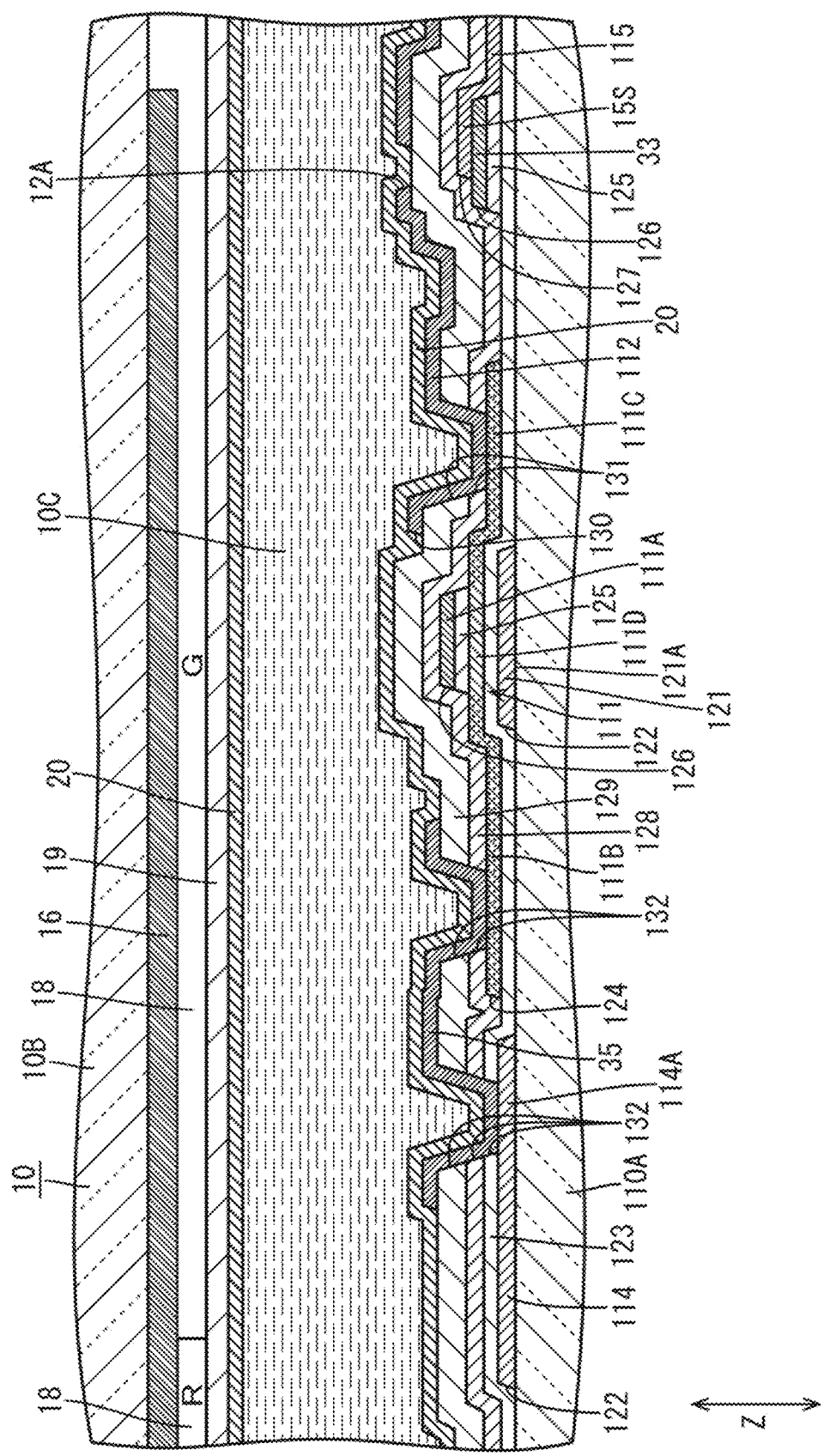
FIG. 14 is a cross-sectional view of the liquid crystal panel along line A-A in FIG. 12.

As illustrated in FIG. 12, the source regions 111B of the TFTs 111 are disposed adjacent to source line branches 114A of the source lines 114 in the X-axis direction. The source regions 111B are disposed not to overlap the source line branches 114A. Each source line connecting electrode 35 has a horizontally-long rectangular shape that extends in the X-axis direction. The source line connecting electrodes 35 are disposed to overlap the source regions 111B and the source line branches 114A. As illustrated in FIG. 14, the sections of the third insulator 128 and the fourth insulator 129 overlapping the source regions 111B and the source line connecting electrodes 35 include first source line contact holes 132 drilled through the third insulator 128 and the fourth insulator 129. The first source line contact holes 132 are for connecting the source regions 111B to the source line connecting electrodes 35. The sections of the first insulator 123, the third insulator 128, and the fourth insulator 129 overlapping the source line branches 114A of the source lines 114 and the source line connecting electrodes 35 include second source line contact holes 132 drilled through the first insulator 123, the third insulator 128, and the fourth insulator 129. The second source line contact holes 132 are for connecting the source line branches 114A to the source line connecting electrodes 35. This embodiment includes two types of source line contact holes 132. The source line connecting electrodes 35 prepared from the second transparent electrode film 130 are connected to the source regions 111B prepared from a semiconductor film 124 via the first source line contact holes 132 and to the source line branches 114A of the source lines 114 prepared from the first metal film 122 via the second source line contact holes 132. According to the configuration, the image signals transmitted through the source lines 114 are supplied to the source regions 111B via the source line connecting electrodes 35.

Figure 15:
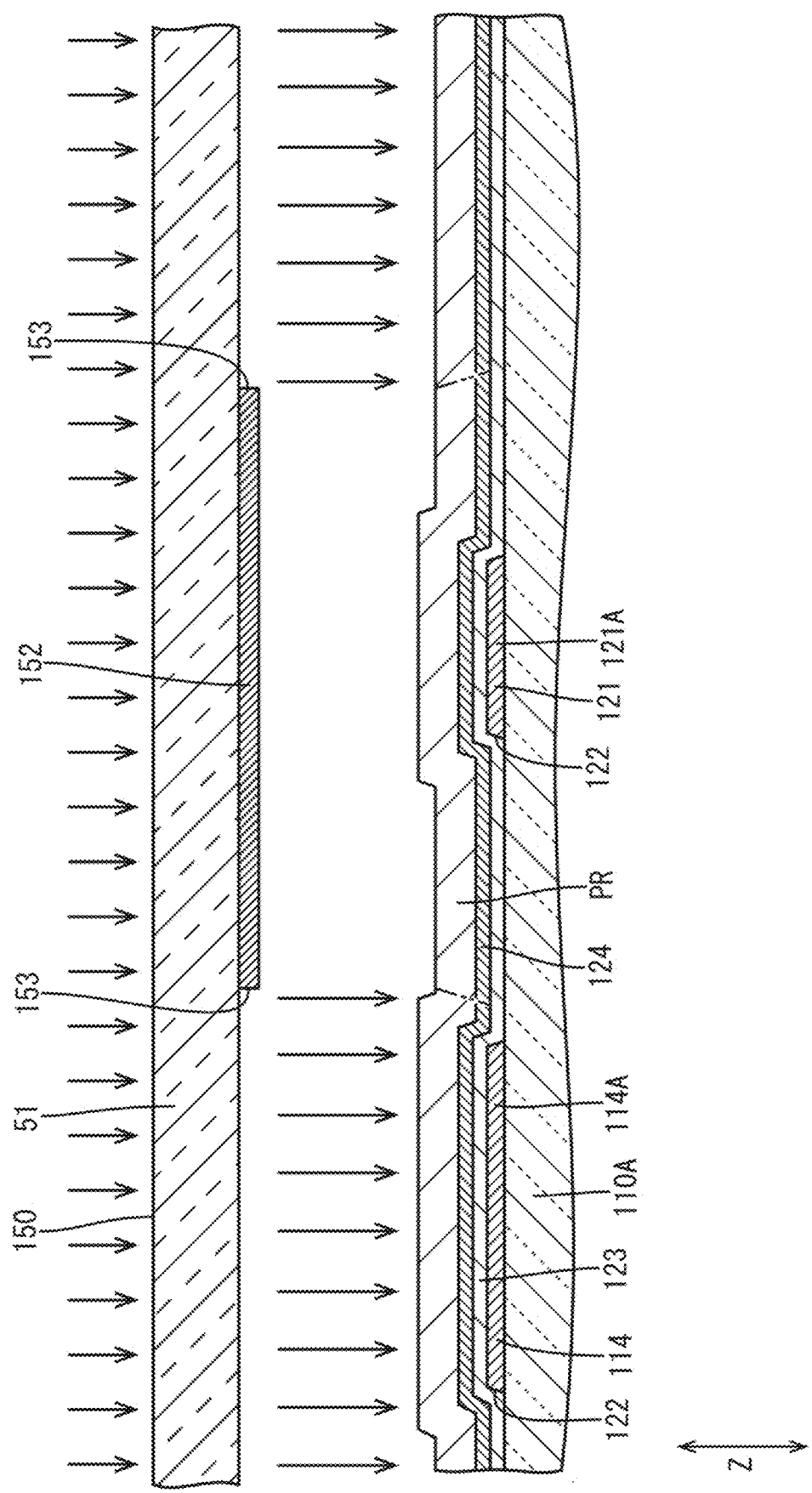
FIG. 15 is a cross-sectional view along line A-A in FIG. 12 illustrating a photoresist film exposed in a semiconductor film forming step in a method of producing the array substrate.

An array substrate 110A in this embodiment has the configuration described above. Next, steps of a method of producing the array substrate 110A different from those of the first embodiment will be mainly described. As illustrated in FIG. 15, an area of a photomask 150 used in a semiconductor film forming step included in the method of producing the array substrate 110A does not overlap the source lines 114. When a photoresist film PR is exposed via the photomask 150 and developed, exposed sections of the photoresist film PR are removed. Remaining sections of the photoresist film PR are located not to overlap the source lines 114. Etching is performed using the photoresist film PR, sections of the semiconductor film 124 overlapping the source lines 114 are all removed. The first metal film forming step, the second metal film and second insulator forming step, and the first transparent electrode film forming step are similar to those of the first embodiment.

Figure 16:
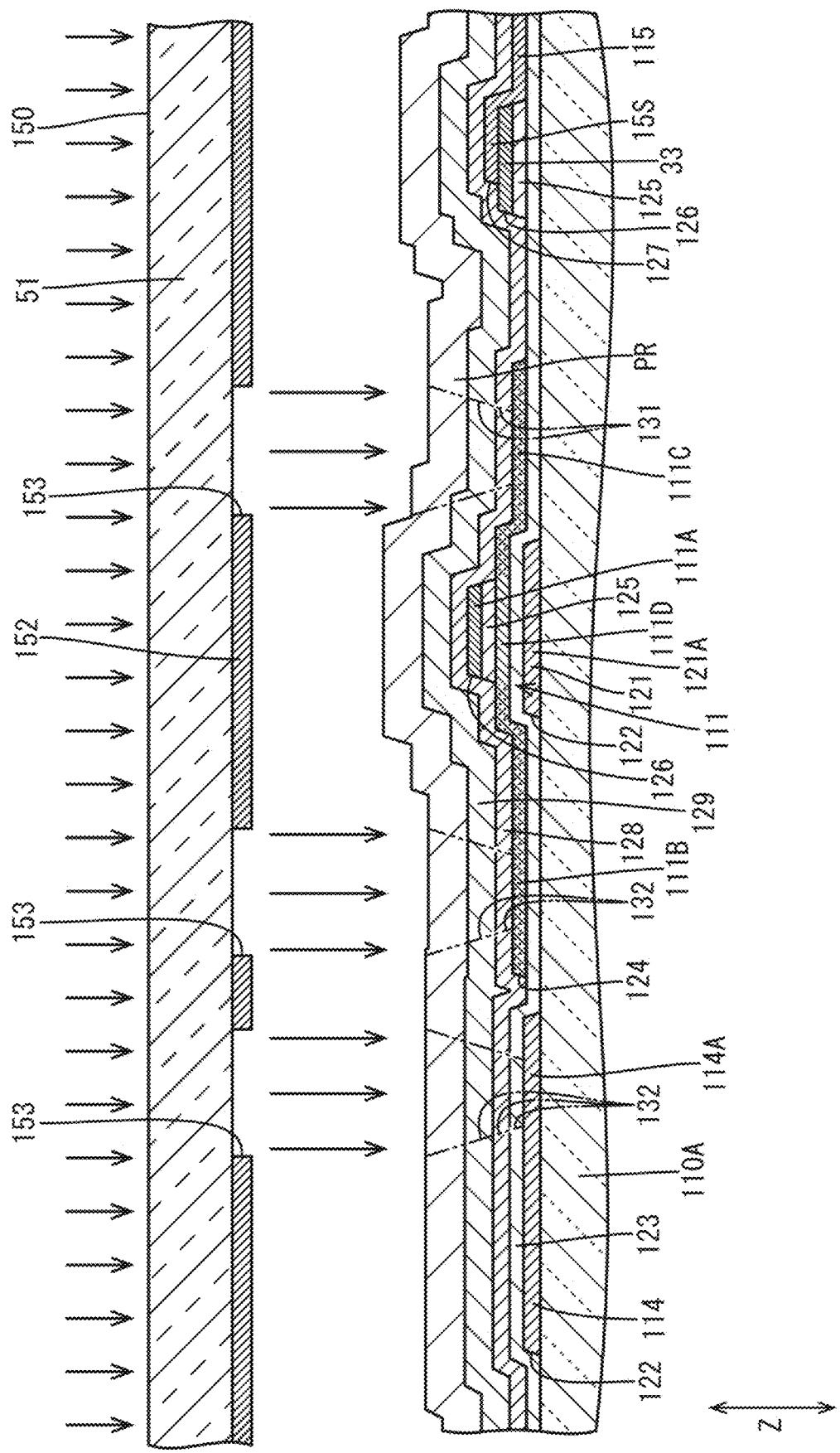
FIG. 16 is a cross-sectional view along line A-A in FIG. 12 illustrating the photoresist film exposed in a third insulator and a fourth insulator forming step in the method of producing the array substrate.

As illustrated in FIG. 16, holes 153 of a photomask 150 used in the third insulator and fourth insulator forming step match pixel electrode contact holes 131 and two types of the source line contact holes 132. The holes 153 match the gate contact holes 36 and the light blocking portion contact holes 37 (see FIG. 13). The holes 153 are disposed separately from one another at positions overlapping the pixel electrode contact holes 131, two types of the source line contact holes 132, the gate contact holes 36, and the light blocking portion contact holes 37, respectively. When the photoresist film PR is exposed and developed, exposed sections of the photoresist film PR are removed. Sections of the fourth insulators other than the sections in which the pixel electrode contact holes 131, two types of the source line contact holes 132, the gate contact holes 36, and the light blocking portion contact holes 37 are to be formed are covered with the photoresist film PR. Through etching using the photoresist film PR, sections of the fourth insulator 129 not covered with the photoresist film PR are removed. At the same time, sections of the first insulator 123 and the third insulator 128 in layers lower than the fourth insulator 129 not covered with the photoresist film PR are removed. By ashing the photoresist film PR or removing the photoresist film PR using a remover, the first insulator 123, the third insulator 128, and the fourth insulator 129 are patterned and the pixel electrode contact holes 131, two types of the source line contact holes 132, the gate contact holes 36, and the light blocking portion contact holes 37 are formed at the same time.

Figure 17:
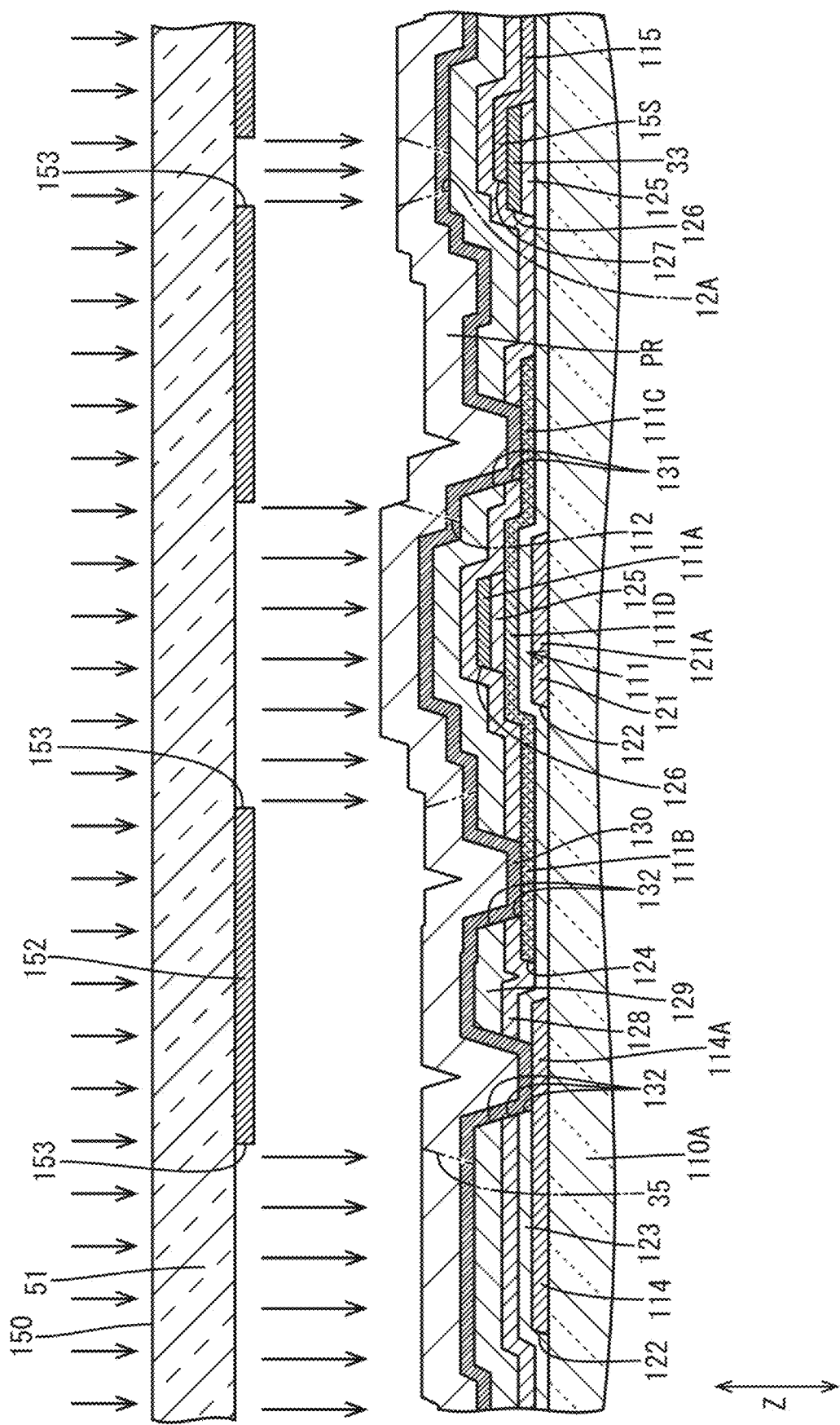
FIG. 17 is across-sectional view along line A-A in FIG. 12 illustrating the photoresist film exposed in a second transparent electrode film forming step in the method of producing the array substrate.

As illustrated in FIG. 17, a photomask 150 in the second transparent electrode film forming step includes the light blocking film 152 formed in areas that match areas of the array substrate 110A in which the pixel electrodes 112, the source line connecting electrodes 35, and the gate connecting electrodes 34 are to be formed although the areas that match the areas in which the gate connecting electrodes 34 are to be formed (see FIG. 13). When a photoresist film PR is exposed and exposed sections are removed, the areas of the second transparent electrode film 130 in which the pixel electrodes 112, the gate connecting electrodes 34, and the source line connecting electrodes 35 are to be formed are covered with the photoresist film PR. By etching the photoresist film PR, sections of the second transparent electrode film 130 not covered with the photoresist film PR are removed. By ashing the photoresist film PR or removing the photoresist film PR using a remover, the second transparent electrode film 130 is patterned and the pixel electrodes 112, the gate connecting electrodes 34, and the source line connecting electrodes 35 are formed.

According to the method of producing the array substrate 110A in this embodiment, the pixel electrode contact holes 131, two types of the source line contact holes 132, the gate contact holes 36, and the light blocking portion contact holes 37 are formed at the same time in the third insulator and fourth insulator forming step. Therefore, it is not required for independent patterning of the first insulator 123. In this embodiment, the first insulator forming step for forming the first insulator 123 is performed after the first metal film forming step. Then, the semiconductor film forming step is performed to produce the array substrate 110A. This embodiment requires six photomasks 150 to produce the array substrate 110A. In comparison to the known method, the number of the photomasks 150 is reduced by two.

According to this embodiment, as described above, a common electrode 115 is disposed in the layer lower than the pixel electrodes 112 with the third insulator 128 and the fourth insulator 129 between the common electrode 115 and the pixel electrodes 112. The third insulator 128 and the fourth insulator 129 are the inter-electrode insulator. The source lines 114 are connected to the TFTs 111. The source lines 114 are disposed in the layer lower than the gate lines 113 with the first insulator 123 and a second insulator 125 between gate lines 113 and the source lines 114. The first insulator 123 and the second insulator 125 are the inter-line insulators. The TFTs 111 include the drain regions 111C and the source regions 111B. The drain regions 111C are disposed to overlap the sections of the pixel electrodes 112 with the third insulator 128 and the fourth insulator 129 between the TFTs 111 and the sections of the pixel electrodes 112. The third insulator 128 and the fourth insulator 129 form the inter-electrode insulator. The drain regions 11C are connected to the pixel electrodes 112 via the pixel electrode contact holes 131 drilled through the third insulator 128 and the fourth insulator 129. The source regions 111B are connected to the source lines 114. The source line connecting electrodes 35 (the second line connecting electrodes) are disposed to overlap at least sections of the source lines 114 and the source regions 111B. The source line connecting electrodes 35 are connected to the source lines 114 and the source regions 111B via at least two types of the source line contact holes 132 formed in the third insulator 128, the fourth insulator 129, and the first insulator 123. The third insulator 128 and the fourth insulator 129 are the inter-electrode insulator. The first insulator 123 is the inter-line insulator. The source line connecting electrodes 35 is prepared from the second transparent electrode film 130 (the conductive film) from which the pixel electrodes 112 are prepared. According to the configuration, the gate lines 113 are insulated from the source lines 114 by the first insulator 123 and the second insulator 125 that are the inter-line insulator disposed between the gate lines 113 and the source lines 114. The signals transmitted through the source lines 114 are supplied to the source line connecting electrodes 35 via the source line contact holes 132 drilled through the third insulator 128, the fourth insulator 129, and the first insulator 123. The third insulator 128 and the fourth insulator 129 are the inter-electrode insulator and the first insulator 123 is the inter-line insulator. The signals are then supplied to the source regions 111B via other source line contact holes 132. The signals supplied to the source regions 111B are supplied to the drain regions 111C and then to the pixel electrodes 112 via the pixel electrode contact holes 131 drilled through the third insulator 128 and the fourth insulator 129 that form the inter-electrode insulator. During the etching of the third insulator 128 and the fourth insulator 129 that form the inter-electrode insulator to form the pixel electrode contact holes 131 in the production, the third insulator 128 and the fourth insulator 129 that form the inter-electrode insulator and the first insulator 123 that is the inter-line insulator are etched to form at least two types of the source line contact holes 132. Namely, the third insulator 128 and the fourth insulator 129 that form the inter-electrode insulator and the first insulator 123 that is the inter-line insulator are patterned using the common photomask 150. Therefore, the number of the photomasks 150 required for the production can be reduced.

The TFTs 111 include the gate electrodes 111A disposed to overlap the channel regions 111D from the upper layer side via the second insulator 125 (the gate insulator) and coupled to the gate lines 113. The gate electrodes 111A are prepared from the second metal film 126 from which the gate lines 113 are prepared. The drain regions 111C are disposed to overlap the sections of the pixel electrodes 112 via the third insulator 128 and the fourth insulator 129 that form the inter-electrode insulator. The drain regions 111C are connected to the pixel electrodes 112 via the pixel electrode contact holes 131 drilled through the third insulator 128 and the fourth insulator 129 that form the inter-electrode insulator. The gate connecting electrodes 34 are disposed to overlap at least the sections of the gate lines 113, the gate electrodes 111A, and the light blocking portions 121. The gate connecting electrodes 34 are connected to the gate lines 113, the gate electrodes 111A, and the light blocking portions 121 via the light blocking portion contact holes 37 drilled through the third insulator 128 and the fourth insulator 129 that are the inter-electrode insulator and the first insulator 123 that is the inter-line insulator. The gate connecting electrodes 34 are prepared from the second transparent electrode film 130 from which the pixel electrodes 112 are prepared. The signals transmitted through the gate lines 113 are supplied to the gate electrodes 111A and then to the gate connecting electrodes 34 via the gate contact holes 36 drilled through the third insulator 128 and the fourth insulator 129 that form the inter-electrode insulator. Then, the signals are supplied to the light blocking portions 121 via the light blocking portion contact holes 37 drilled through the third insulator 128 and the fourth insulator 129 that form the inter-electrode insulator and the first insulator 123 that is the interline insulator. The channel regions 111D of the TFTs 111 are sandwiched between the gate electrodes 111A in the upper layer and the light blocking portions 121 in the lower layer. The second insulator 125 is disposed between the channel regions 111D and the gate electrodes 111A. The first insulator 123 that is the inter-line insulator is disposed between the channel regions 111D and the light blocking portions 121. The signals are input to the gate electrodes 111A and the light blocking portions 121 at the same timing. As a result, the charge transfer occurs between the source regions 111B and the drain regions 111C via the channel regions 111D and a large amount of charge flow is achieved. During the etching of the third insulator 128 and the fourth insulator 129 that form the inter-electrode insulator to form the pixel electrode contact holes 131, the third insulator 128 and the fourth insulator 129 that form the inter-electrode insulator to form the gate contact holes 36. Furthermore, the third insulator 128 and the fourth insulator 129 that are the inter-electrode insulator and the first insulator 123 that is the inter-line insulator are etched to form the light blocking portion contact holes 37. Namely, the third insulator 128 and the fourth insulator 129 that form the inter-electrode insulator and the first insulator 123 that is the inter-line insulator are patterned using the common photomask 150. Therefore, the number of the photomasks 150 required for the production can be reduced.

Third Embodiment

A third embodiment will be described in detail with reference to FIGS. 18 and 19. The third embodiment includes a method of producing an array substrate 210A different from the method of the second embodiment. Components, functions, and effects similar to those of the second embodiment previously described will not be described.

Figure 18:
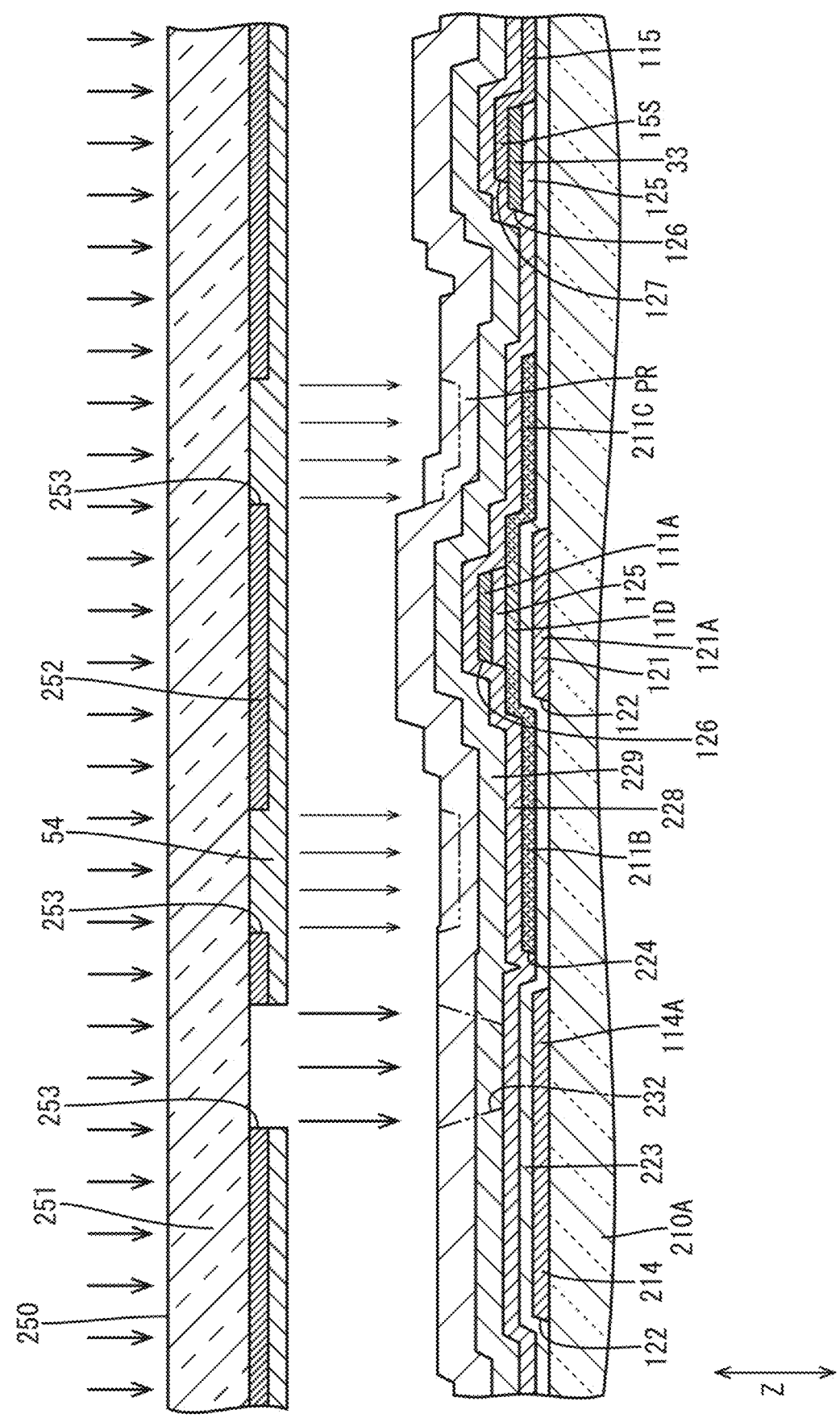
FIG. 18 is across-sectional view along line A-A in FIG. 12 illustrating a photoresist film exposed in a third insulator and a fourth insulator forming step in a method of producing an array substrate according to a third embodiment.
Figure 19:
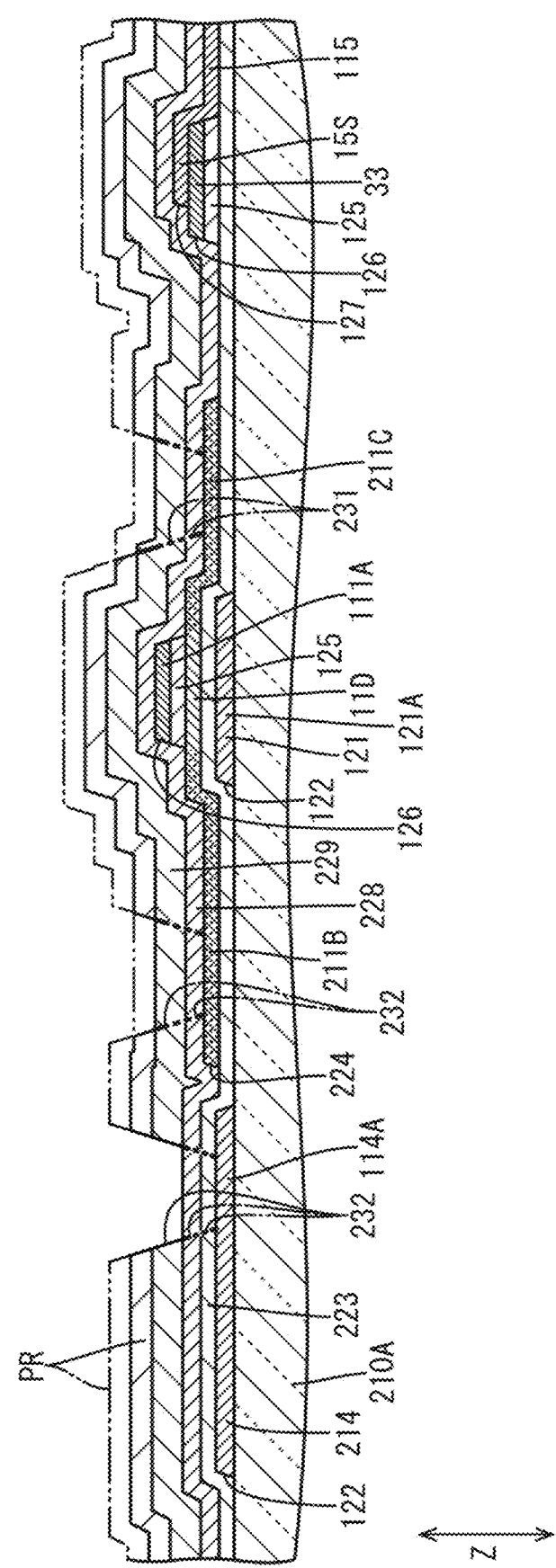
FIG. 19 is across-sectional view along line A-A in FIG. 12 illustrating the photoresist film without sections that are exposed through semitransparent portions of the photomask and removed by ashing in the third insulator and the fourth insulator forming step in the method of producing the array substrate.

As illustrated in FIG. 18, in a third insulator and fourth insulator forming step included in the method of producing the array substrate 210A according to this embodiment, a photomask 250 that is a halftone mask including a semitransmissive film 54. The semitransmissive film 54 has transmittance to pass exposure light from the exposure device higher than the transmittance of a light blocking film (which is about equal to 0%) and lower than transmittance of a base 251. The semitransmissive film 54 is disposed on a light blocking film 252 on an opposite side from the base 251. The light blocking film 252 includes holes 253 that include first source line contact holes 232 overlapping source regions 211B, pixel electrode contact holes 231, and gate contact holes. The semitransmissive film 54 is disposed to overlap the first source line contact holes 232, the pixel electrode contact holes 231, and the gate line contact holes. The holes 253 formed in the light blocking film 252 include second source line contact holes 232 overlapping source lines 214 and light blocking portion contact holes. The semitransmissive film 54 is disposed not to overlap the second source line contact holes 232 and the light blocking portion contact holes. The photomask 250 includes areas that overlap the holes 253 and the semitransmissive film 54. The areas have light transmittance lower than that of the transmissive areas but higher than that of the light blocking areas.

When the photomask 250 described above is exposed in the third insulator and fourth insulator forming step, as illustrated in FIG. 18, sections of the photoresist film PR overlapping areas of the array substrate 210A in which the second source line contact holes 232 and the light blocking portion contact holes are to be formed are exposed through the transmissive sections of the photomask 250. Sections of the photoresist film PR overlapping areas of the array substrate 210A in which the first source line contact holes 232, the pixel electrode contact holes 231, and the gate contact holes are to be formed are exposed through the semitransmissive sections of the photomask 250. When the development is performed, sections of the photoresist film PR exposed through the transmissive sections of the photomask 250 are removed but sections of the photoresist film PR exposed through the semitransmissive sections of the photomask 250 with a thickness smaller than that of the non-exposed sections remain. When the etching is performed, sections of a fourth insulator 229 not covered with the photoresist film PR (the sections overlapping the second source line contact holes 232 and the light blocking portion contact holes) are removed. During the etching, the sections of the fourth insulator 229 overlapping the first source line contact holes 232, the pixel electrode contact holes 231, and the gate contact holes are not removed. When the etching progresses such that the second source line contact holes 232 and the light blocking portion contact holes are drilled only through the fourth insulator 229, ashing is performed on the photoresist film PR as illustrated in FIG. 19. Sections of the photoresist film PR exposed through the semitransmissive sections of the photomask 250 are removed by the ashing but non-exposed sections of the photoresist film PR remain. In FIG. 19, the photoresist film PR before the ashing is indicated by long dashed double-dotted lines. The sections of the fourth insulator 229 overlapping the areas in which the first source line contact holes 232, the pixel electrode contact holes 231, and the gate contact holes are to be formed are not covered with the photoresist film PR. When the etching is performed again, the sections of a third insulator 228 and the fourth insulator 229 not covered with the photoresist film PR (the sections overlapping the areas in which two types of the source line contact holes 232, the pixel electrode contact holes 231, the gate contact hole, and the light blocking portion contact holes are to be formed) are removed. In FIG. 19, two types of the source line contact holes 232 and the pixel electrode contact holes 231 formed through the second etching are indicated by thick long dashed double-doted lines. Through the second etching, sections of a first insulator 223 disposed in the layer lower than the third insulator and the sections of the third insulator 228 disposed in the layer lower than the fourth insulator 229 not covered with the photoresist film PR are removed. The contact holes 231 and 232 are formed by removing the insulators 223, 228, and 229 by two for the respective contact holes 231 and 232 through the second etching. Therefore, source regions 221B and drain regions 211C prepared from a semiconductor film 224 are less likely to be over-etched. The remaining sections of the photoresist film PR are removed by ashing or using a remover. The first insulator 223, the third insulator 228, and the fourth insulator 229 are patterned. The pixel electrode contact holes 231, two types of the source line contact holes 232, the gate contact holes, and the light blocking portion contact holes are formed at the same time.

Fourth Embodiment

A fourth embodiment will be described in detail with reference to FIGS. 20 and 21. The fourth embodiment includes a common electrode 315 having a configuration different from that of the second embodiment. Components, functions, and effects similar to those of the second embodiment previously described will not be described.

Figure 20:
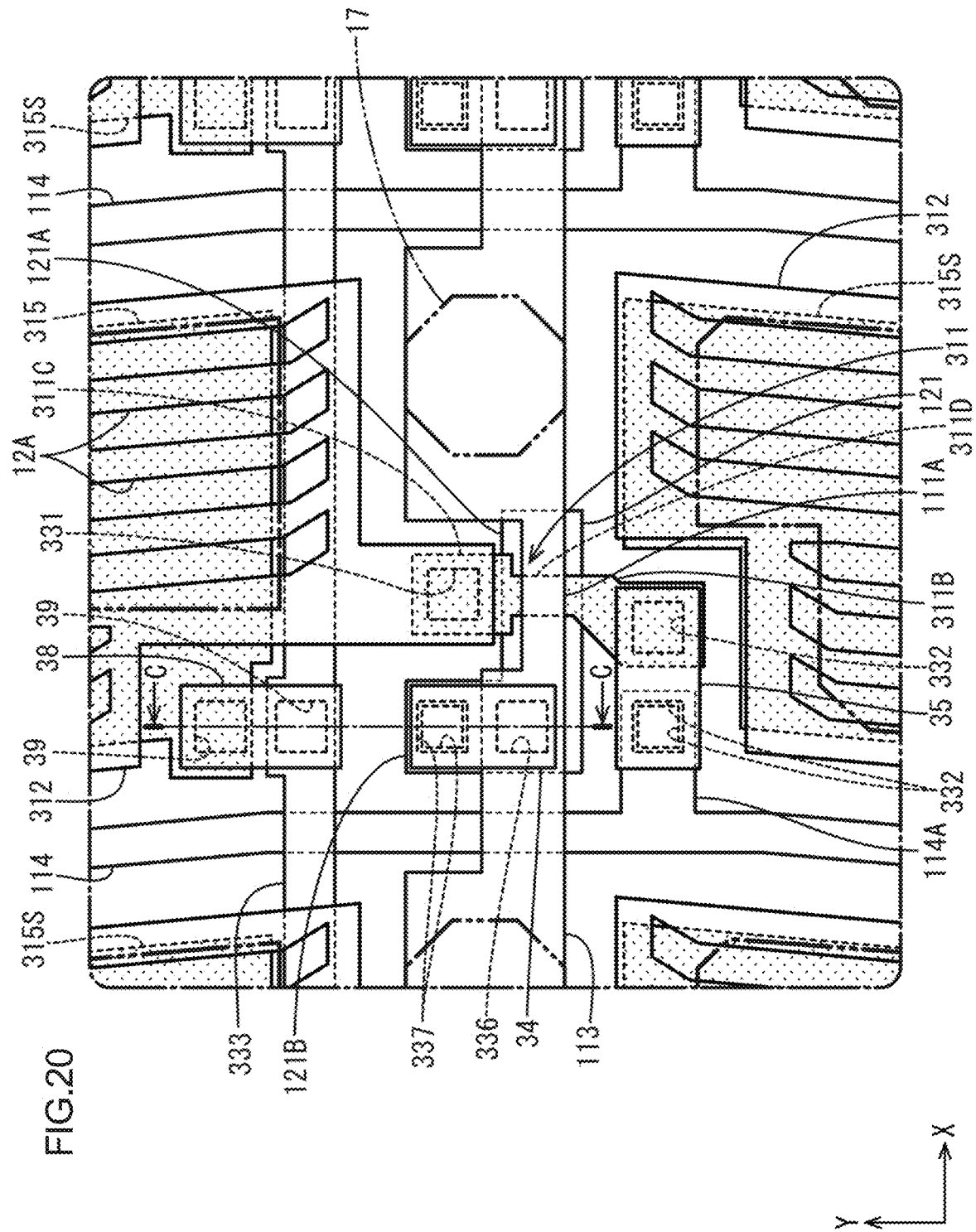
FIG. 20 is a magnified plan view illustrating a portion of an array substrate including a TFT and therearound according to a fourth embodiment.
Figure 21:
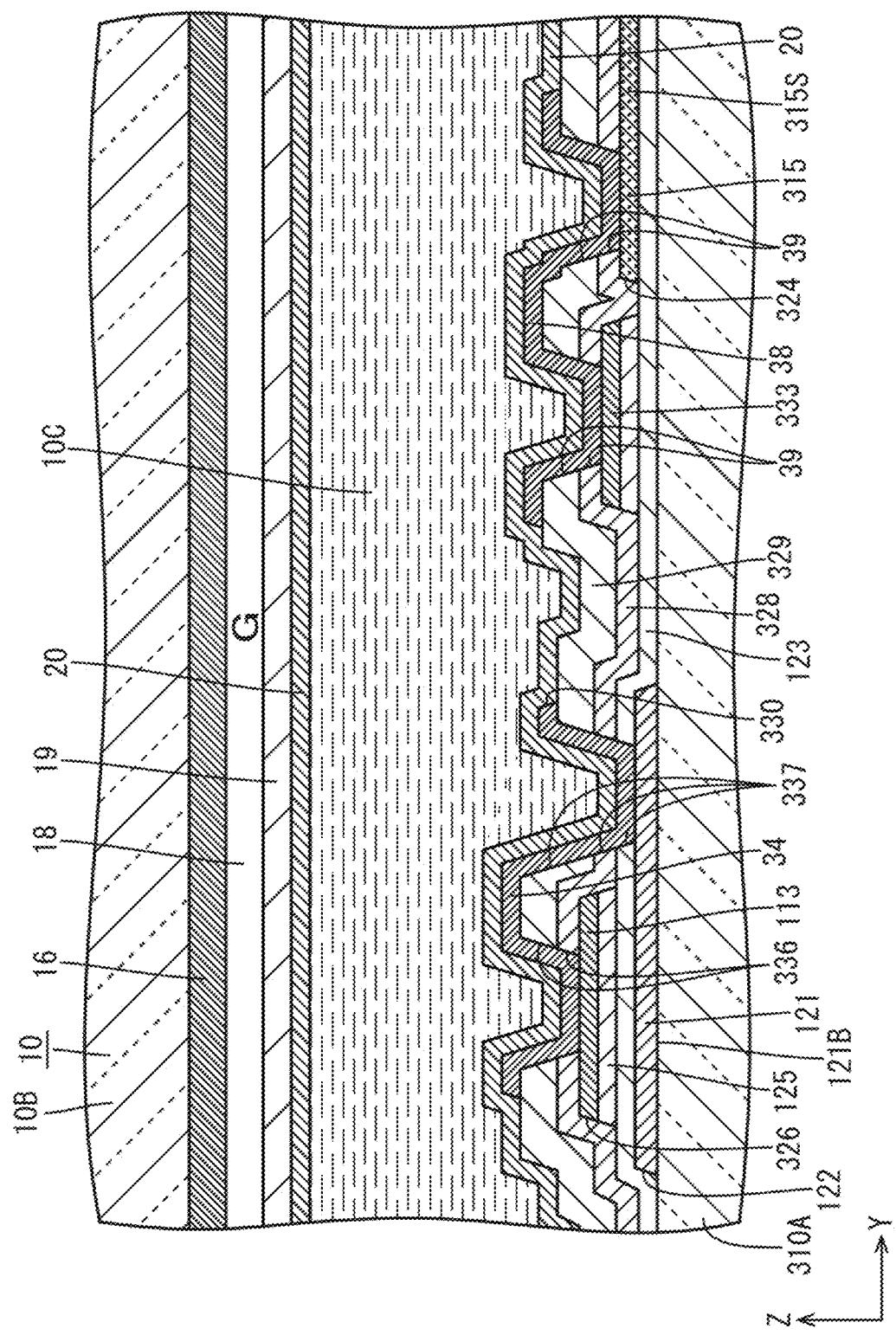
FIG. 21 is a cross-sectional view of a liquid crystal panel along line C-C in FIG. 20.

As illustrated in FIGS. 20 and 21, the common electrode 315 in this embodiment is prepared from a semiconductor film 324 from which source regions 311B, drain regions 311C, and channel regions 311D of TFTs 311 are prepared. Specifically, the common electrode 315 includes resistance reduced sections (conductivity increased sections) prepared by reducing a resistance of sections of the semiconductor film 324 similar to the source regions 311B and the drain regions 311C. A large portion of the common electrode 315 overlaps pixel electrodes 312 but not overlap common lines 333 prepared from a second metal film 326. In FIG. 20, the resistance reduced sections of the semiconductor film are indicated by hatching. An array substrate 310A includes common electrode connecting electrodes 38 for connecting the common electrode 315 prepared from the semiconductor film 324 to the common lines 333 prepared from the second metal film 326. The common electrode connecting electrodes 38 are prepared from a second transparent electrode film 330 from which the pixel electrodes 312 are prepared. Each common electrode connecting electrode 38 has a vertically-elongated shape extending in the Y-axis direction. The common electrode connecting electrodes 38 are disposed to overlap the common electrode 315 and the common lines 333. Sections of a third insulator 328 and a fourth insulator 329 overlapping the common electrode connecting electrodes 38 and the common electrode 315 and sections of the third insulator 328 and the fourth insulator 329 overlapping the common electrode connecting electrodes 38 and the common lines 333 include common electrode contact holes 39 drilled through the third insulator 328 and the fourth insulator 329. The common electrode contact holes 39 are for connecting the overlapping sections to each other. The common electrode connecting electrodes 38 are connected to the common electrode 315 via the first common electrode contact holes 39 and to the common lines 333 via the second common electrode contact holes 39. According to the configuration, a common potential supplied to the common lines 333 is supplied to the common electrode 315 (common electrode segments 315S) via the common electrode connecting electrodes 38.

The array substrate 310A in this embodiment does not include a first transparent electrode film 127 (see FIG. 14) included in the second embodiment. Therefore, a method of producing the array substrate 310A does not include the first transparent electrode film forming step and thus the photomask used in the first transparent electrode film forming step is not required. During etching of the third insulator 328 and the fourth insulator 329 in a first insulator and fourth insulator forming step included in the method of producing the array substrate 310A to form pixel electrode contact holes 331, two types of source line contact holes 332, gate contact holes 336, and light blocking portion contact holes 337, two types of the common electrode contact holes 39 are formed. The common electrode connecting electrodes 38 are formed at the same time when the pixel electrodes 312 are formed in the second transparent electrode film forming step. The array substrate 310A in this embodiment is prepared using five photomasks. In comparison to the known technology, the number of the photomasks can be reduced by three.

As describe above, in this embodiment, the TFTs 311 include the drain regions 311C (pixel connecting portions) disposed to overlap sections of the pixel electrodes 312 via the third insulator 328 and the fourth insulator 329 that form the inter-electrode insulator and connected to the pixel electrodes 312 via the pixel electrode contact holes 331 drilled through the third insulator 328 and the fourth insulator 329 that are the inter-electrode insulator. The common electrode 315 is prepared from the semiconductor film 324 (a conductive film) from which the drain regions 311C are prepared. The common electrode connecting electrodes 38 are disposed to overlap the sections of the common electrode 315 and the common lines 333 and connected to the common electrode 315 and the common lines 333 via at least two types of the common electrode contact holes 39 drilled through the third insulator 328 and the fourth insulator 329 that form the inter-electrode insulator. The common electrode connecting electrodes 38 are prepared from the second transparent electrode film 330 from which the pixel electrodes 312 are prepared. According to the configuration, signals supplied to the drain regions 311C of the TFTs 311 are supplied to the pixel electrodes 312 via the pixel electrode contact holes 331 drilled through the third insulator 328 and the fourth insulator 329 that are the inter-pixel electrode insulators. The common potential supplied to the common lines 333 are supplied to the common electrode connecting electrodes 38 via the common electrode contact holes 39 drilled through the third insulator 328 and the fourth insulator 329 that are the inter-electrode insulator and then supplied to the common electrode 315 via other common electrode contact holes 39. During the etching of the third insulator 328 and the fourth insulator 329 that are the inter-electrode insulator to form the pixel electrode contact holes 331 in the production, at least two types of the common electrode contact holes 39 are formed are drilled through the third insulator 328 and the fourth insulator 329 that are the inter-electrode insulator. Namely, the third insulator 328 and the fourth insulator 329 that are the inter-electrode insulator can be patterned using the common photomask. Therefore, the number of the photomasks required for the production can be reduced.

The TFTs 311 include the channel regions 311D prepared from the semiconductor film 324 and connected to the drain regions 311C. The common electrode 315 and the drain regions 311C are prepared by reducing the resistances of the sections of the semiconductor film 324. In a configuration in which the common electrode 315 and the drain regions 311C are prepared from a conductive film that is different from the semiconductor film 324, forming and patterning of the conductive film are required. According to this embodiment, such forming and patterning are not required. Therefore, the number of photomasks required for the production can be reduced.

Other Embodiments

The technology described herein is not limited to the embodiments described above and illustrated by the drawings. For example, the following embodiments will be included in the technical scope of the technology described herein.

(1) In each of the above embodiments, the third insulator and the fourth insulator are disposed on top of each other to provide the inter-electrode insulator having a double layer structure. However, one of the third insulator and the fourth insulator may be omitted and the inter-electrode insulator having a single layer structure may be provided. Namely, in each of the first to the third embodiments, the third insulator or the fourth insulator may be disposed between the common electrode prepared from the first transparent electrode film and the pixel electrodes prepared from the second transparent insulator. In the fourth embodiment, the third insulator or the fourth insulator may be disposed between the common electrode prepared from the semiconductor film and the pixel electrodes prepared from the second transparent electrode film.

(2) In each of the above embodiments, the third insulator and the fourth insulator are disposed on top of each other to provide the inter-electrode insulator having the double layer structure. However, three or more insulators may be disposed on top of one another to provide an inter-electrode insulator having a multilayer structure including a triple layer structure.

(3) In the first embodiments, each TFT has the single gate structure including the gate electrode and the light blocking portion that are not connected to each other. However, a TFT having a double gate structure including a gate electrode and a light blocking portion that are connected to each other may be used. In this case, a gate connecting electrode prepared from the second transparent electrode film may be used for connecting the gate electrode to the light blocking portion as in each of the second to the fourth embodiment.

(4) In the first embodiments, the source line branches of the source lines are directly connected to the source regions of the TFTs. However, the source line branches of the source lines may be connected to the source regions of the TFTs using source line connecting electrodes prepared from the second transparent electrode film.

(5) In each of the second to the fourth embodiments, each TFT has the double gate structure including the gate electrode and the light blocking portion. However, a TFT having a single gate structure including a gate electrode and a light blocking portion that are not connected to each other as in the first embodiment.

(6) In each of the second to the fourth embodiments, the source line branches of the source lines are connected to the source regions of the TFTs using the source line connecting electrodes prepared from the second transparent electrode film. However, the source line branches of the source lines may be directly connected to the source regions of the TFTs.

(7) In each of the second to the fourth embodiments, the gate connecting electrodes are connected to the gate lines via the gate contact holes. However, the gate connecting electrodes may be connected to the gate electrodes via the gate contact holes.

(8) In the production of the array substrate having the configuration described in the fourth embodiment section, the halftone mask in the third embodiment may be used in the third insulator and fourth insulator forming step.

(9) In each of the above embodiments, the array substrate includes the top-gate type TFTs including the gate electrodes disposed in the layer upper than the channel regions. However, bottom-gate type TFTs including gate electrodes disposed in a layer lower than channel regions may be used.

(10) In each of the above embodiments, the photoresist films made of the photosensitive resin materials are used for patterning of the insulators according to the method of producing the array substrate. However, some of the insulators may be made of the photosensitive materials. The insulators made of the photosensitive materials may be directly exposed without using the photoresist films and developed to pattern the insulators.

(11) In each of the above embodiments, the sections of the semiconductor film included in the array substrate are configured as the resistance reduced sections. However, an entire section of the semiconductor film may be configured as a resistance non-reduced section without any resistance reduced sections.

(12) In each of the above embodiments, the plasma processing is used for the resistance reducing process. However, vacuum annealing may be used for the resistance reducing process.

(13) In each of the above embodiments, the photoresist films used in the method of producing the array substrate are made of the positive photosensitive materials. However, the photoresist films may be made of negative photosensitive materials. In this case, the light transmissive sections and the light blocking sections of the photomasks may be set the other way around to those of the photomasks in each of the above embodiments.

(14) In each of the above embodiments, the halftone mask is used for the photomask in the method of producing the array substrate. However, a gray-tone mask including light transmissive sections and semi-light transmissive sections similar to those of the halftone mask may be used. The gray-tone mask includes slits with a resolution equal to or lower than that of the exposure device. With the slits, the semi-light transmissive sections are provided.

(15) In each of the above embodiments, the TFTs are two-dimensionally arranged in a zigzag pattern on the array substrate. However, the TFTs may be two-dimensionally arranged in a matrix.

(16) In each of the above embodiments, each gate line includes the sections with the different widths. However, each gate line may have a substantially constant width.

(17) The liquid crystal panel in each of the above embodiments may be configured to operate in TN mode, VA mode, or IPS mode. If the liquid crystal panel is configured to operate in the TN mode or the VA mode, the common electrode segments function as auxiliary capacitance lines for forming auxiliary capacitances between the common electrode segments and the pixel electrodes via the inter-electrode insulator. The auxiliary capacitances are in parallel to liquid crystal capacitances formed between the pixel electrodes and the common electrode (a common electrode is provided on the opposed substrate other than the common electrode segments that function as auxiliary capacitance electrodes in the TN mode or the VA mode) via the liquid crystal layer and used for holding the liquid crystal capacitance.

(18) In each of the above embodiments, the array substrate included in the transmission type liquid crystal panel is provided as an example. However, an array substrate included in a reflection type liquid crystal panel or a semi-transmission type liquid crystal panel may be another example.

(19) In each of the above embodiments, the semiconductor film is made of the oxide semiconductor. However, the semiconductor film may be made of amorphous silicon or polysilicon (LTPS).

(20) In each of the above embodiments, the liquid crystal panel has the screen size of 64.5 inches or 32.2 inches. However, the screen size may be altered where appropriate.

(21) In each of the above embodiments, the array substrate included in the liquid crystal panel is provided as an example. However, array substrates included in other types of display panels (e.g., organic EL display panels and microcapsule electrophoretic display (EPD) panels) may be provided as other examples.

The invention claimed is:

1. An array substrate comprising:
   pixel electrodes;
   an inter-line insulator positioned below the pixel electrodes;
   switching components connected to the pixel electrodes, the switching components including channel regions which are portions of a semiconductor film, the channel regions being above the inter-line insulator;
   a line connected to the switching components, the line being a first portion of a conductive film;
   a common line above the inter-line insulator, the common line being a second portion of the conductive film;
   a common electrode including common electrode segments under sections of the pixel electrodes, respectively, but not overlapping the line, the common electrode segments including:
      first surfaces being opposite the interline insulator and the common line and including first sections abutting the interline insulator and second sections abutting the common line; and
      second surfaces being opposite the sections of the pixel electrodes; and
   an inter-electrode insulator including first sections abutting the second surfaces of the common electrode segments and second sections abutting the inter-line insulator; wherein
   the common line extends to straddle the common electrode segments and is connected to the common electrode segments.

2. The array substrate according to claim 1, wherein
   the switching components include pixel connecting portions disposed to overlap sections of the pixel electrodes via the inter-electrode insulator and connected to the pixel electrodes via pixel electrode contact holes drilled through the inter-electrode insulator,
   the common electrode includes sections configured as the pixel connecting portions, and
   the array substrate further comprises a common electrode connecting electrode that is a section of a conductive film that includes sections configured as the pixel electrodes, connected to the common electrode and the common line via at least two common electrode contact holes drilled through the inter-electrode insulator, and disposed to overlap sections of the common electrode and the common line.

3. The array substrate according to claim 2, wherein the common electrode and the pixel connecting portions are sections of the semiconductor film having reduced resistances.

4. The array substrate according to claim 1, wherein the inter-electrode insulator is between the common electrode and the pixel electrodes,
the array substrate further includes a second line connected to the switching components and disposed in a layer lower than an inter-line insulator, and
the switching components include second line connecting portions that are sections of semiconductor film, disposed to overlap sections of the second line, and connected to the second line via second line contact holes drilled through the inter-line insulator.

5. The array substrate according to claim 1, wherein the inter-electrode insulator is between the common elect the pixel electrodes,
the array substrate further includes a second line connected to the switching components and disposed in a layer lower than the line via an inter-line insulator,
the switching components include pixel connecting portions and second line connecting portions, the pixel connecting portions being disposed to overlap sections of the pixel electrodes via the inter-electrode insulator and connected to the pixel electrodes via pixel electrode contact holes drilled through the inter-electrode insulator, the second line connecting portions being connected to the second line, and
the array substrate further comprises second line connecting electrodes disposed to overlap at least sections of the second line and the second line connecting portions and connected to the second line and the second line connecting portions via at least two second line contact holes drilled through the inter-electrode insulator and the inter-line insulator, the second line connecting electrodes being sections of a conductive film that includes sections configured as the pixel electrodes.

6. The array substrate according to claim 1, wherein the array substrate further includes a second line connected to the switching components and below the line,
the interline insulator includes sections hole between the line and the second line,
the switching components include second line connecting portions, pixel connecting portions, and channel regions, the second line connecting portions being connected to the second line, the pixel connecting portions being connected to the pixel electrodes, the channel regions including first ends connected to the second line connecting portions and second ends connected to the pixel connecting portions, the channel regions being sections of a semiconductor film,
the array substrate further includes a light blocking portion under the channel regions, and
the second line and the light blocking portion are sections of a conductive film.

7. The array substrate according to claim 6, wherein the switching components include gate electrodes disposed to overlap the channel regions from an upper layer side via a gate insulator and coupled to the line, the gate electrodes being sections of the conductive film that includes a section configured as the line,
the pixel connecting portions are disposed to overlap sections of the pixel electrodes via the inter-electrode insulator and connected to the pixel electrodes via pixel electrode contact holes drilled through the inter-electrode insulator, and
the array substrate further comprises gate connecting electrodes disposed to overlap at least sections of the line or the gate electrodes and the light blocking portion and connected to the line or the gate electrodes and the light blocking portion via gate contact holes drilled through the inter-electrode insulator and light blocking portion contact holes drilled through the inter-electrode insulator and the inter-line insulator, the gate connecting electrodes being sections of a conductive film that includes sections configured as the pixel electrodes.

8. A display device comprising:
an array substrate; and
an opposed substrate opposed to the array substrate; wherein
the array substrate includes:
  pixel electrodes;
  an inter-line insulator positioned below the pixel electrodes;
  switching components connected to the pixel electrodes, the switching components including channel regions which are portions of a semiconductor film, the channel regions being above the inter-line insulator;
  a line connected to the switching components, the line being a first portion of a conductive film;
  a common line above the inter-line insulator, the common line being a second portion of the conductive film;
  a common electrode including common electrode segments under sections of the pixel electrodes, respectively, but not overlapping the line, the common electrode segments including:
    first surfaces being opposite the inter-line insulator and the common line and including first sections abutting the inter-line insulator and second sections abutting the common line; and
    second surfaces being opposite the sections of the pixel electrodes; and
  an inter-electrode insulator including first sections abutting the second surfaces of the common electrode segments and second sections abutting the inter-line insulator; and
  the common line extends to straddle the common electrode segments and is connected to the common electrode segments.

* * * * *

UNITED STATES PATENT AND TRADEMARK OFFICE
CERTIFICATE OF CORRECTION

PATENT NO. : 11,101,294 B2
APPLICATION NO. : 16/655940
DATED : August 24, 2021
INVENTOR(S) : Masahiro Yoshida Page 1 of 1

It is certified that error appears in the above-identified patent and that said Letters Patent is hereby corrected as shown below:

On the Title Page

In the Related U.S. Application Data, item (60), "Provisional application No. 62/747,802, filed on Nov. 19, 2018" should be replaced with --Provisional application No. 62/747,802, filed on Oct. 19, 2018--

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*